US006383920B1

(12) United States Patent
Wang et al.

(10) Patent No.: US 6,383,920 B1
(45) Date of Patent: May 7, 2002

(54) PROCESS OF ENCLOSING VIA FOR IMPROVED RELIABILITY IN DUAL DAMASCENE INTERCONNECTS

(75) Inventors: Ping-Chuan Wang, New Paltz; Ronald G. Filippi, Wappingers Falls; Robert D. Edwards, Malboro; Edward W. Kiewra, Verbank; Roy C. Iggulden, Newburgh, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/757,894

(22) Filed: Jan. 10, 2001

(51) Int. Cl.⁷ ........................................... H01L 21/4763
(52) U.S. Cl. ........................ 438/639; 438/637; 438/638; 438/672
(58) Field of Search ................................. 438/637, 638, 438/639, 669, 672; 257/775, 773

(56) References Cited

U.S. PATENT DOCUMENTS

| | | | |
|---|---|---|---|
| 4,961,822 A | 10/1990 | Liao et al. | 156/656 |
| 5,229,325 A | 7/1993 | Park et al. | 437/187 |
| 5,470,788 A | 11/1995 | Biery et al. | 437/190 |
| 5,571,740 A | 11/1996 | Peterson et al. | 437/151 |
| 5,571,751 A | 11/1996 | Chung et al. | 437/187 |
| 5,658,830 A | 8/1997 | Jeng et al. | 438/620 |
| 5,661,344 A | 8/1997 | Havemann et al. | 257/758 |
| 5,674,787 A | 10/1997 | Zhao et al. | 437/230 |
| 5,910,020 A | 6/1999 | Yamada et al. | 438/624 |
| 5,970,374 A | 10/1999 | Teo et al. | 438/629 |
| 5,989,623 A | 11/1999 | Chen et al. | 427/97 |
| 6,013,574 A | 1/2000 | Hause et al. | 438/622 |
| 6,017,817 A | 1/2000 | Chung et al. | 438/637 |
| 6,023,102 A | 2/2000 | Nguyen et al. | 257/774 |
| 6,054,378 A | 4/2000 | Skala et al. | 438/620 |
| 6,060,380 A | 5/2000 | Subramanian et al. | 438/618 |
| 6,066,557 A | 5/2000 | Lukane et al. | 438/639 |
| 6,069,071 A | 5/2000 | Hasunuma et al. | 438/637 |
| 6,077,733 A | 6/2000 | Chen et al. | 438/182 |
| 6,156,648 A | * 12/2000 | Huang | 438/654 |
| 6,261,963 B1 | * 7/2001 | Zhao et al. | 438/704 |

OTHER PUBLICATIONS

A High Performance 0.13um Copper BEOL Technology with Low-k Dielectric, R.D. Goldblatt, et al. Proceeding of 2000 International Interconnect Technology Conference, pp. 261–263, 2000 IEEE.
IBM Technical Disclosure Bulletin, Elimination of CMOS Electromigration–Induced Extrusions, J.E. Cronin and P.A. Farrar, vol. 31, No. 6, Nov. 1988, IBM Corporation.

* cited by examiner

*Primary Examiner*—Trung Dang
*Assistant Examiner*—William M. Brewster
(74) *Attorney, Agent, or Firm*—Margaret A. Pepper

(57) ABSTRACT

The present invention relates generally to a method of enclosing a via in a dual damascene process. In one embodiment of the disclosed method, the via is etched first and a first barrier metal or liner is deposited in the via, the trench is then etched and a second barrier metal or liner is deposited in the trench, and finally the via and trench are filled or metallized in a dual damascene process, thereby forming a via or interconnect and a line. Alternatively, the trench may be etched first and a first barrier metal or liner deposited in the trench, then the via is etched and a second barrier metal or liner is deposited in the via, and finally the trench and via are filled or metallized in a dual damascene process. The barrier metal or liner encloses the via, thereby reducing void formation due to electromigration.

27 Claims, 15 Drawing Sheets

PROCESS OF ENCLOSING VIA FOR IMPROVED RELIABILITY IN DUAL DAMASCENE INTERCONNECTS

FIELD OF THE INVENTION

The present invention relates generally to the manufacture of semiconductor devices, and more particularly to a method of enclosing a metal via in a dual damascene process.

BACKGROUND OF THE INVENTION

Damascene processes are widely used in the manufacture of semiconductor devices. Generally, in a damascene process, a dielectric layer is first deposited on a substrate, a portion of the dielectric layer is then removed by an etching process in accordance with a mask pattern, the etched areas in the dielectric layer are lined with a barrier metal and then filled with a metal, and finally the excess liner and metal deposited over the dielectric layer is removed in a planarization process. By this method, metal features such as vias or lines are formed on a substrate.

Typically, vias and lines are formed in separate damascene processes, known as single damascene. For example, to form a layer of metal lines on a substrate, a dielectric layer is first deposited, then a portion of the dielectric layer is etched according to a mask pattern which corresponds to the desired line pattern, a metal liner is then deposited on the dielectric layer and in the etched line areas in the dielectric layer, these etched line areas are then filled with a metal, and finally the excess metal and liner on top of the dielectric layer is removed in a planarization process. A layer of vias are formed in a similar process, except that the mask pattern corresponds to the desired via pattern. Thus, to form a layer of vias and lines, two metal fill steps and two metal planarization steps are required.

In the electronics industry, there is a current trend toward using more cost effective dual damascene in the fabrication of interconnection structures. In a dual damascene process, both the via and the line are formed in the same damascene process. To form the via and the line in the same damascene process, a thicker dielectric layer is first deposited on a substrate, the dielectric layer is then etched according to a mask pattern which corresponds to both the desired via pattern and the desired line pattern, a liner is then deposited on the dielectric layer and in the etched areas in the dielectric layer, these etched areas are then filled with a metal, and the excess metal and liner is removed by a planarization process. This dual damascene process therefore reduces the number of costly metal fill and planarization steps.

However, recent studies have shown that interconnection structures formed using a dual damascene process are susceptible to failure caused by electromigration effects. FIG. 1 illustrates a cross sectional view of a wafer stack 100 formed using a conventional dual damascene process. The wafer stack 100 includes a substrate 102, an oxide layer 104, a metal layer 106, a dielectric layer 108, a liner 110, a metal via 112 and a metal line 114. The metal via 112 and metal line 114 are formed by a dual damascene process in which the dielectric layer 108 is first deposited on top of the metal layer 106, the dielectric layer 108 is then etched to form via 112 and trench 114 according to a mask pattern which defines the desired line and via pattern, the liner 110 is deposited on the dielectric layer 108 and in the etched portions of the dielectric layer 108, a metal is then deposited in the via 112 and trench 114, and finally the excess metal and liner on top of the dielectric layer 108 are removed by a planarization process.

In this wafer stack configuration, when an electric potential is applied across the metal via 112 and metal line 114, the electric potential causes an electromigration effect in the metal via 112 and metal line 114. Specifically, the electric potential causes one portion of the interconnect structure to be a cathode and the other portion to an anode. The electric potential between the cathode and the anode causes a current flow from the anode end to the cathode end through metal via 112 and metal line 114. Since the direction of electrons is opposite of the direction of current flow, the electrons migrate from the cathode end of the metal via 112 toward the anode end of the metal line 114. In this process, the moving electrons generate an "electron wind" which pushes or forces the metal atoms in the direction of the electrons from the metal via 112 near the cathode to the metal line 114 near the anode. The liner 110 prevents the electrons and atoms in the metal layer 106 from migrating to the metal via 112 and metal line 114. As a result, a void 116 forms near the cathode in the metal via 112. The formation of this void often leads to catastrophic failure of the device. The failure is catastrophic because the liner 110 at the bottom of the via 112 is often thinner than in the line and therefore is unable to shunt the current across the void.

Void formation due to electromigration is a well known phenomenon. Several methods have been proposed to counteract this electromigration effect in interconnects and thereby prevent void formation. For example, in IBM Technical Disclosure Bulletin Vol. 31, No. 6 (1988), tungsten (W) links are interposed periodically in long aluminum-copper (Al-Cu) lines or minimum groundrule features interfacing contact pads. These tungsten links form a physical barrier to the Al-Cu atoms being transported between the cathode to the anode. As another example, U.S. Pat. No. 5,470,788 to Biery et al. proposes interposing segments of Al with segments of refractory metal such as W.

Each of these methods utilize the "short-length effect." The short-length effect takes place in short interconnections if an electrical current is supplied through leads of materials in which the diffusivity of the interconnection metal is low. The physical origin of the short-length effect is the build-up of backstress. As interconnection metal atoms pile up against the diffusion barrier leads, this backstress counteracts the electromigration driving force. A steady-state condition arises in situations where the backstress exactly balances the electromigration driving force. Under this condition, no further electromigration damage occurs.

The existence of the short-length effect has been demonstrated by several investigators, such as by H. V. Schreiber in the article "Electromigration Threshold of Aluminum Films" published in Solid State Electronics, Vol. 28, No. 6, p. 617; by R. G. Filippi et al., in the article "Evidence of the Electromigration Short-Length Effect in Aluminum Based Metallurgy with Tungsten Diffusion Barriers" published in the Proceedings of the Materials Research Symposium, Vol. 309, pp. 141–148,; and by X. X. Li et al., in the article "Increase in Electromigration Resistance by Enhancing Backflow Effect" published in the Proceedings of the 30th International Reliability Physics Symposium, March 1992, p. 211.

The short-length effect has been used advantageously to reduce the electromigration effect in via-line interconnects by enclosing or encapsulating the via. For example, U.S. Pat. No. 6,054,378 to Skala et al. ("Skala") discloses a method for encapsulating a metal via in a damascene process. The encapsulation of the metal via with a conductive barrier layer prevents the electromigration of interconnect metal atoms from the via to the line and thereby prevents voiding at the bottom of the via.

Although the method disclosed in the Skala patent is described as a dual damascene process, an examination of the process steps reveals that the via and line actually are formed in two single damascene processes. Referring to FIGS. 2A–2I of Skala, the via is formed, encapsulated, filled and planarized in the single damascene process depicted in FIGS. 2B–2E. Then the trench is formed, encapsulated, filled and planarized in a second single damascene process depicted in FIGS. 2F–2I. As discussed previously, a dual damascene process is more cost effective because the metal fill and planarization steps are performed only once. Therefore, there is a need in the art for a method of enclosing a via using a dual damascene process.

In the formation of a semiconductor device interconnect, it is often desirable to form the via prior to forming the trench. Forming the via first may be desirable because the via lithography and anti-reflective coating (ARC) etch are carried out on a planar surface, which is advantageous because the via lithography has a smaller process window than the line lithography. The ARC and photoresist for the line lithography then fills in the via holes, providing a fairly planar surface for the line lithography.

There are also advantages to forming the trench prior to forming the via. When the via is formed first, etch residues accumulate along the via sidewalls. These etch residues are derived from organic material from the line lithography which forms hardened polymers when subjected to the line etch chemistry. As dimensions shrink, it becomes increasingly difficult to adequately clean the etch residues from the very small and relatively deep vias. By forming the trench first, etch residues are more easily removed from the relatively shallow trench.

In the Skala method, the via must be formed prior to the line. If the line is formed first using the single damascene process described in the Skala patent, then the via cannot be formed in a subsequent second single damascene process for two reasons. First, if the via photomask is positioned such that the via is superimposed over the line, then the metallized line and barrier layer must be etched prior to etching the underlying dielectric layer. The conditions required for etching of a metallized line and barrier layer are impractical for many fill and barrier metals. For example, there is no known etching process that will reliably etch through copper as the bulk fill metal.

Alternatively, if the via photomask is positioned such that the via is adjacent to the barrier layer of the line, etching of the line metal and barrier layer metal is no longer necessary. However, this scenario relies on an overlay tolerance in the photolithography process used to form the via which is unachievable in present-day processes. In semiconductor devices with line widths or via diameters of about 0.1 $\mu$m to about 1 $\mu$m, the barrier layer is only about 10 Å to about 1000 Å thick. Thus, the error in photomask alignment must be substantially less than this range of 10–1000 Å. This degree of overlay tolerance is unachievable using present-day photolithography processes. Therefore, there is a need in the art for a robust method of enclosing a via, in which either the line or the via can be formed first.

SUMMARY OF THE INVENTION

In accordance with the present invention, a process is disclosed for enclosing a via in a semiconductor device. This process includes a dual damascene process wherein the via and the trench are filled in the same metallization step. Moreover, with this process, either the via or the trench can be formed first.

In one aspect of the present invention, the process of enclosing a via comprises the steps of: (a) forming a dielectric layer over a first metal layer, wherein the dielectric layer has a thickness; (b) forming a via in the dielectric layer, wherein the via has a depth at least equal to the thickness of the dielectric layer, thereby defining a sidewall of the dielectric layer and exposing a portion of the first metal layer; (c) conformally depositing a first metal liner in the via, wherein the first metal liner includes a bottom portion deposited over the exposed portion of the first metal layer and a sidewall portion deposited over the sidewall of the dielectric layer; (d) forming at least one trench in the dielectric layer adjacent to the first metal liner, wherein the trench has a depth less than the thickness of the dielectric layer, thereby defining a trench bottom and a trench sidewall and exposing an upper portion of said sidewall portion of the first metal liner; (e) conformally depositing a second metal liner in the trench, wherein at least a portion of the second metal liner is deposited over the trench bottom and over the trench sidewall; and (f) depositing a second metal layer over the first metal liner and the second metal liner, wherein the second metal layer substantially fills the via and the trench.

In another aspect of the present invention, the process for enclosing a via comprises the steps of: (a) forming a dielectric layer over a first metal layer, wherein the dielectric layer has a thickness; (b) forming a partial via in the dielectric layer, wherein the partial via has a depth less than the thickness of the dielectric layer, thereby defining a partial via bottom and a partial via sidewall; (c) conformally depositing a first metal liner in the partial via, wherein the first metal liner includes a sidewall portion deposited over the partial via sidewall; (d) forming at least one trench in the dielectric layer adjacent to the first metal liner, wherein the trench has a depth less than the thickness of the dielectric layer, thereby defining a trench sidewall and a trench bottom and exposing a portion of said sidewall portion of the first metal liner; (e) forming a full via in the dielectric layer which comprises the partial via and a portion extending from the partial via bottom to the first metal layer, wherein the full via has a depth at least equal to the thickness of the dielectric layer, thereby defining a via sidewall of the dielectric layer and exposing a portion of the first metal layer; (f) conformally depositing a second metal liner in the trench and in the full via, wherein at least a portion of the second metal liner is deposited over the trench sidewall and the trench bottom, over said via sidewall of the dielectric layer, and over said exposed portion of the first metal layer; and (g) depositing a second metal layer over the first metal liner and second metal liner, wherein the second metal layer substantially fills the trench and the full via.

In yet another aspect of the present invention, the process for enclosing a via comprises the steps of: (a) forming a dielectric layer over a first metal layer, wherein the dielectric layer has a thickness; (b) forming a trench in the dielectric layer, wherein the trench has a depth less than the thickness of the dielectric layer, thereby defining a trench bottom and a trench sidewall; (c) conformally depositing a first metal liner in the trench, wherein the first metal liner includes a bottom portion deposited over the trench bottom and a sidewall portion deposited over the trench sidewall; (d) forming at least one via in the dielectric layer adjacent to the first metal liner, wherein the via has a depth at least equal to the thickness of the dielectric layer, thereby defining a sidewall of the dielectric layer and exposing a portion of the first metal layer and a portion of said sidewall portion of the first metal liner; (e) conformally depositing a second metal liner in the via, wherein at least a portion of the second metal liner is deposited over the sidewall of the dielectric layer and over the exposed portion of the first metal layer; and (f) depositing a second metal layer over the first metal liner and second metal liner, wherein the second metal layer substantially fills the trench and the via.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

FIGS. 2A–2C and 2I–2L illustrate an alternative embodiment of the present invention wherein the via is formed first;

DETAILED DESCRIPTION OF THE PREFERRED EMBODIMENTS

Figure 1:
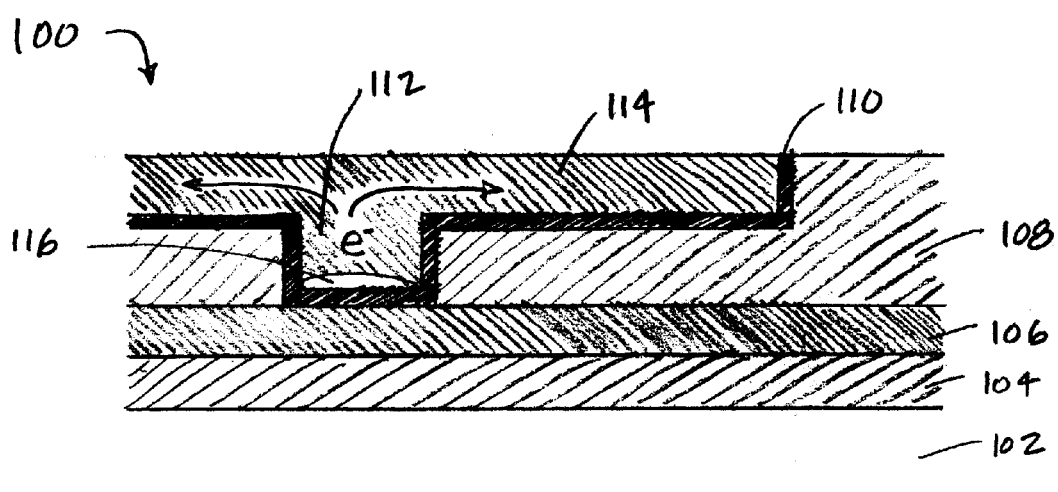
FIG. 1 illustrates a cross-sectional view of a wafer stack formed using a conventional dual damascene process.
Figure 2A:
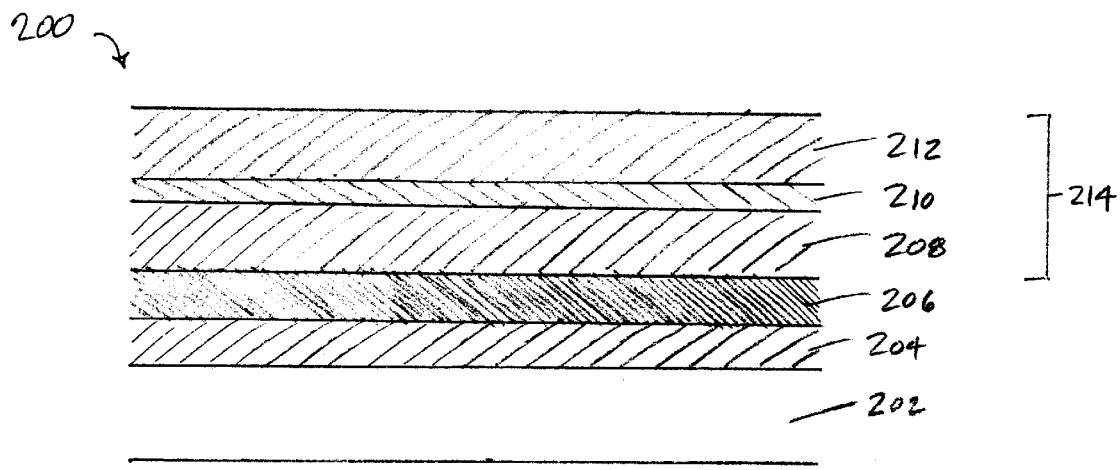
FIGS. 2A–2H illustrate a first embodiment of the present invention wherein the via is formed first.

FIGS. 2A–2H illustrate a preferred embodiment of the present invention wherein the via is formed first. FIG. 2A shows a cross sectional view of a partially fabricated wafer stack 200. A metal layer 206 is first deposited over a substrate 202. A dielectric layer 204 may be formed over substrate 202 prior to depositing metal layer 206. Next, a dielectric layer 214 is formed over metal layer 206. Dielectric layer 214 may comprise a first oxide layer 208, a hardmask layer 210, and a second oxide layer 212.

Metal layer 206 may be deposited using any suitable process such as chemical vapor deposition (CVD), plasma enhanced CVD (PECVD), physical vapor deposition (PVD), sputter deposition, electroplating and electroless plating, or by any other known metallization technique or combination of known metallization techniques. Metal layer 206 may be formed of any suitable metal such as aluminum (Al), copper (Cu), tungsten (W), gold (Au), silver (Ag), or alloys thereof.

It should be appreciated that other additional layers above, below or between dielectric layer 204 and metal layer 206 may be present. For example, a conductive liner typically formed of titanium (Ti), titanium nitride (TiN),W, TiW, tantalum (Ta), tantalum nitride (TaN) or other suitable materials may be deposited between dielectric layer 204 and metal layer 206.

Dielectric layer 214 may be formed over metal layer 206 by any suitable process such as CVD, PECVD, PVD, high density plasma CVD or spin-on glass process. Dielectric layer 214 may be formed from any material capable of functioning as an insulating passivation layer, including inorganic dielectric materials such as silicon dioxide ($SiO_2$), fluoro-silicate glass (FSG), silicon nitride and diamond-like carbon; organic or polymeric dielectric materials such as polyimide, parylene, polytetraflouroethylene, and polymer-based low-k dielectric materials such as Dow SiLK™ and Dow Cyclotene™ (trademarks of The Dow Chemical Company); silicon-containing organic dielectric materials such as benzocyclobutene; and nano-pore containing materials. Dow SiLK™ is a class of polymer-based low-k dielectric materials comprising a b-staged polymer, and Dow Cyclotene™ is a class of polymerbased low-k dielectric materials comprising b-stage divinylsiloxane-bisbenzocyclobutene resin.

Dielectric layer 214 may comprise a first oxide layer 208, a hardmask layer 210, and a second oxide layer 212. Oxide layers 208 and 212 may be formed of an oxide such as silicon dioxide. Hardmask layer 210 may be formed of any material capable of functioning as an etch stop layer, such as silicon nitride ($Si_3N_4$) or silicon oxynitride ($SiO_xN_y$). Oxide layers 208 and 212 may be of any suitable thickness, but typically have a thickness between about 0.2 $\mu$m and about 1 $\mu$m. Hardmask layer 210 also may be of any suitable thickness, but typically has a thickness between about 50 Å and about 500 Å.

Figure 2B:
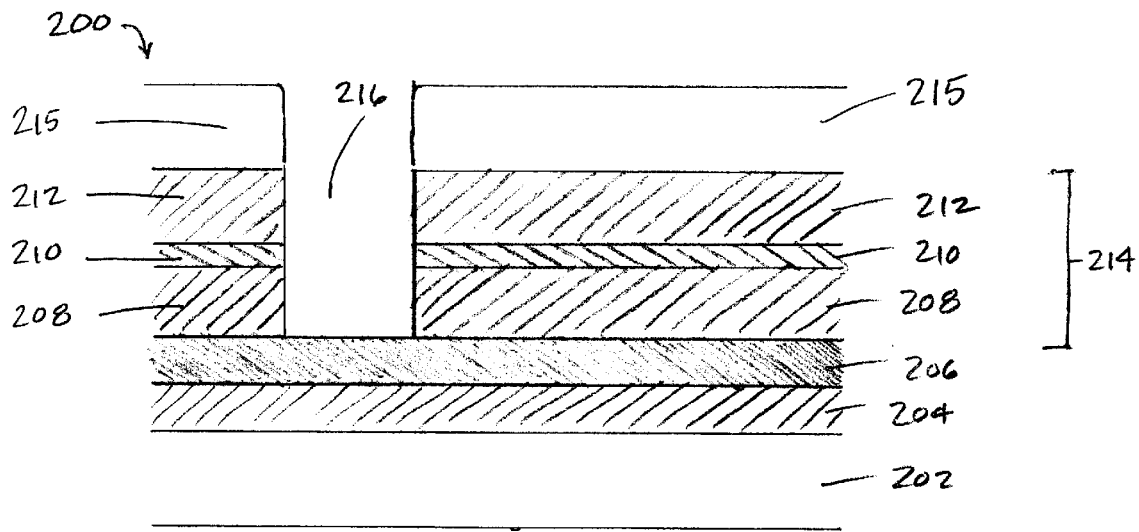

FIG. 2B shows a cross sectional view of the wafer stack 200 after a via 216 has been formed in dielectric layer 214. Via 216 may be formed using any suitable etching process. For example, via 216 may be formed using a photolithography process wherein a photoresist layer 215 is spin-coated and patterned over dielectric layer 214 to form a photomask through exposure and development using, for example, deep ultra-violet (UV) light. The photomask serves to define the etching location or portion over dielectric layer 214. Dielectric layer 214 is then etched through until a portion of metal layer 206 is exposed to form via 216. Any suitable etching process may be used, such as reactive ion etching (RE). If dielectric layer 214 includes oxide layer 208, hardmask layer 210 and oxide layer 212, an etching process is used which is selective to the underlying metal layer 206 but is not selective to hardmask layer 210. For example, oxide layers 208 and 212 and hardmask layer 210 may be etched using a RIE process with $NF_3$, $Cl_2$, Ar and $O_2$. After forming via 216, photoresist layer 215 and any etch residue are removed by a suitable stripping and cleaning process.

Figure 2C:
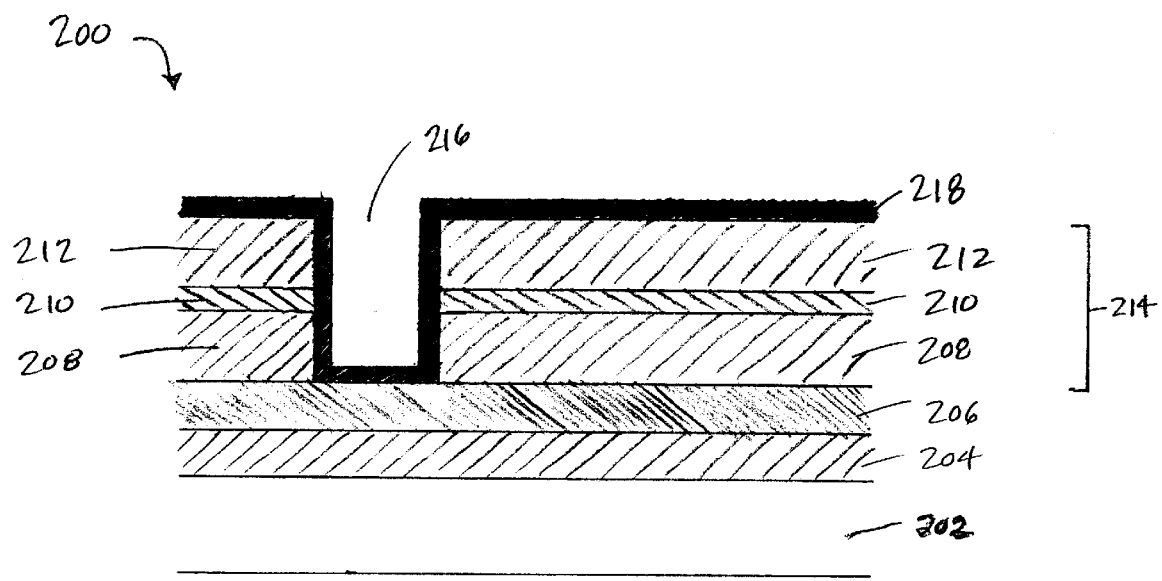

FIG. 2C illustrates a cross sectional view of the wafer stack 200 after a first conductive liner, or via liner, 218 has been deposited. Liner 218 is deposited in a conformal manner over dielectric layer 214 and via 216 such that a portion of liner 218 is formed in the via over the exposed portion of metal layer 206 and the sidewall of dielectric layer 214. Any material suitable for preventing adverse effects (e.g., pitting, spiking, diffusion) from contact between a dielectric layer and a metal layer may be used in liner 218. Typically, liner 218 comprises one or more metals such as Ti, TiN, Ta, TaN, W, TiW, TaSiN, WN, or any other refractory metals and their nitrides. Liner 218 may be deposited by any suitable process, such as by sputter deposition, CVD, PVD or ionized PVD (iPVD). Liner 218 may be of any suitable thickness, but typically has a thickness between about 10 Å and about 1000 Å, preferably between about 25 Å and about 100 Å.

Figure 2D:
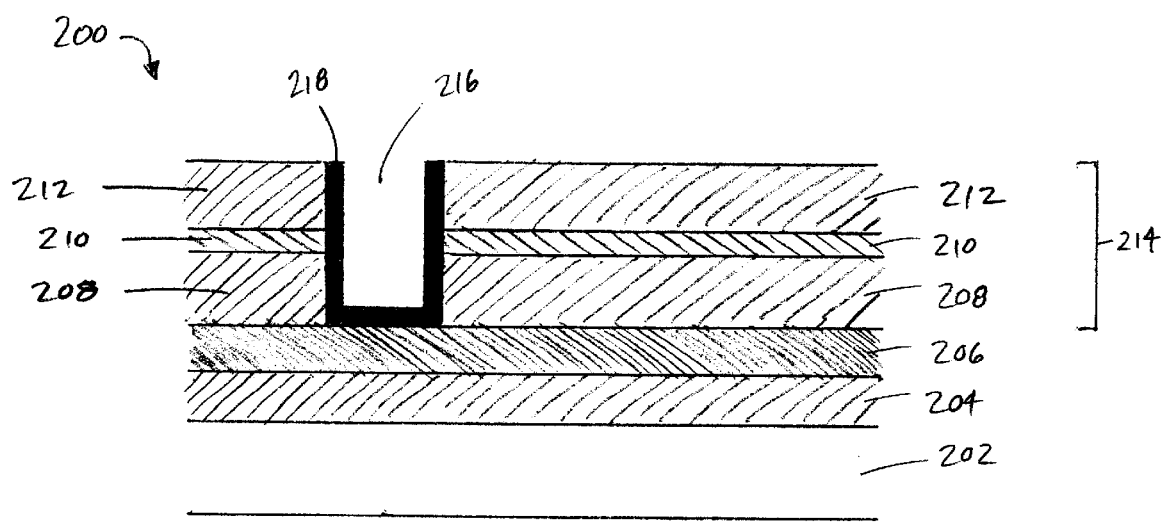

FIG. 2D shows a cross sectional view of the wafer stack 200 after that portion of liner 218 above the top surface of dielectric layer 214 has been removed by a planarization process such as a chemical/mechanical polishing (CMP) process.

Figure 2E:
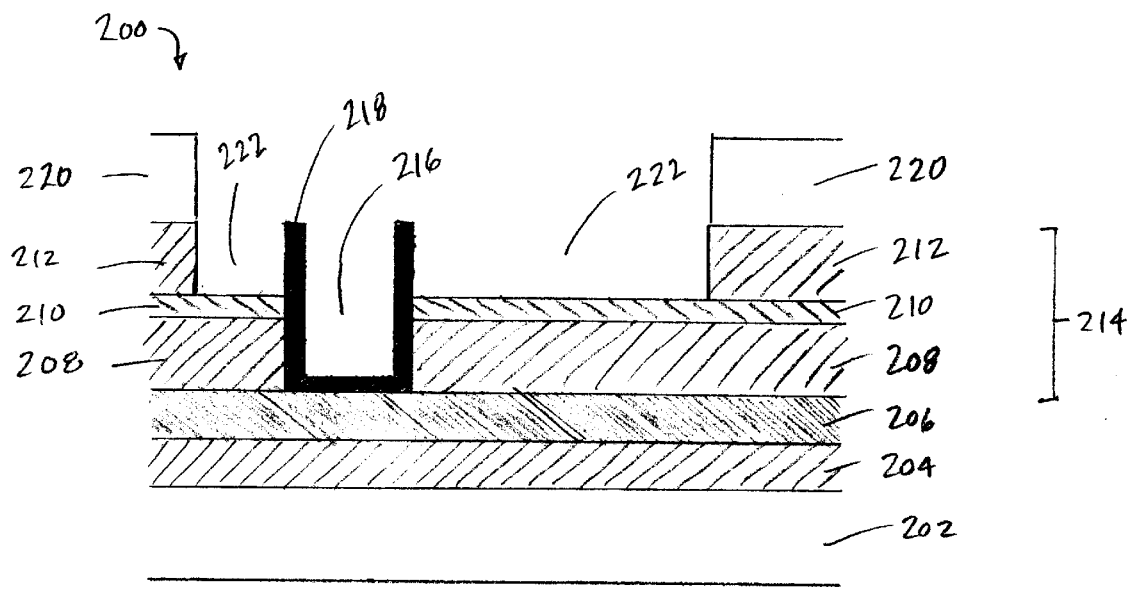

FIG. 2E shows a cross sectional view of the wafer stack 200 after a trench 222 has been formed. Trench 222 may be formed using any suitable etching process. For example, trench 222 may be formed using a photolithography process wherein a photoresist layer 220 is spin-coated and patterned over dielectric layer 214 to form a photomask through exposure and development using, for example, deep UV light. The photomask serves to define the trench location or portion of dielectric layer 214 to be etched. The photomask is positioned so that the trench location or portion to be etched in dielectric layer 214 is adjacent to and at least partially overlies liner 218. The photoresist used in photoresist layer 220 may be the same or different from the photoresist used in photoresist layer 215.

Dielectric layer 214 is then etched to a desired depth to form trench 222. An etching process which is selective to liner 218 must be used. In other words, an etching process which will etch dielectric layer 214, while leaving liner 218 substantially intact, must be used. If dielectric layer 214 includes oxide layer 208, hardmask layer 210 and oxide layer 212, an etching process which is selective to hardmask layer 210 should be used such that a portion of oxide layer 212 is etched down to hardmask layer 210 to form trench 222. For example, oxide layer 212 may be etched using a RIE process with $C_4F_8$, CO and Ar. If no hardmask layer 210 is used, dielectric layer 214 is partially etched through using a timed process. After trench 222 has been formed, photoresist layer 220 and any etch residue are removed by a suitable stripping and cleaning process.

It is important to note that in this process the photomask formed by exposure and development of photoresist layer 220 need not mask the via area 216 on the wafer stack 200. In other words, the photomask pattern may have an opening which corresponds to the full line area including that area which overlays the via area. Thus, a photolithography process with an overlay tolerance much greater than the thickness of liner 218 may be used in this process.

Figure 2F:
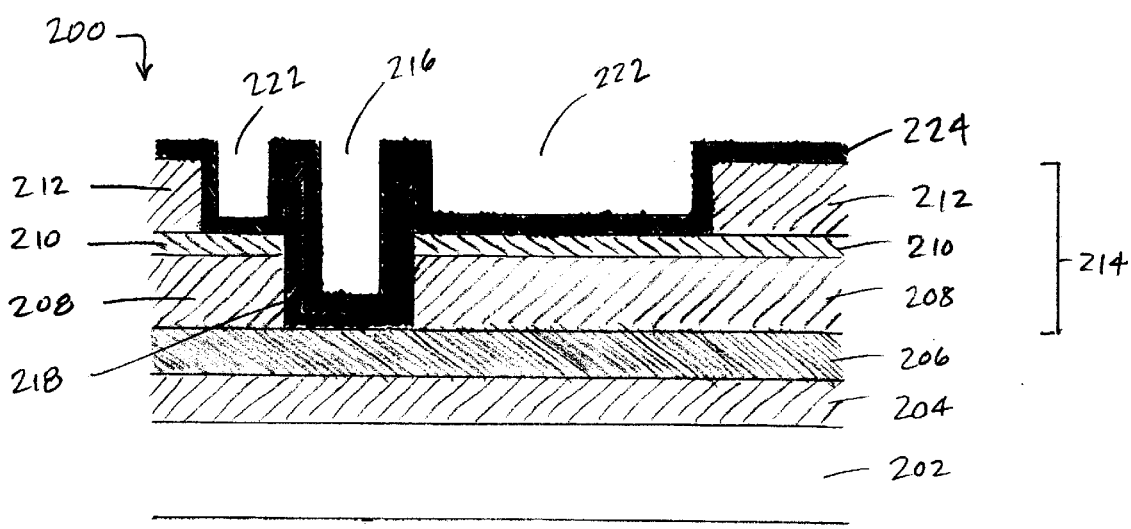

FIG. 2F shows a cross sectional view of the wafer stack 200 after a second conductive liner 224 has been deposited. Liner 224 is deposited in a conformal manner over dielectric layer 214, trench 222 and via 216 such that liner 224 is formed in trench 222 over the exposed portions and sidewalls of dielectric layer 214 and the sidewall of liner 218, and in via 216 over liner 218. If dielectric layer 214 includes oxide layer 208, hardmask layer 210 and oxide layer 212, liner 224 is deposited in trench 222 over the exposed portion of hardmask 210, the sidewall of oxide layer 212, and the sidewall of liner 218. Any material suitable for preventing adverse effects (e.g., pitting, spiking, diffusion) from contact between a dielectric layer and a metal layer may be used in liner 224. Typically, liner 224 comprises one or more metals such as Ti, TiN, Ta, TaN, W, TiW, TaSiN, WN, or any other refractory metals and their nitrides. Liner 224 may be deposited by any suitable process, such as by sputter deposition, CVD, PVD or ionized PVD (iPVD). Liner 224 may be of any suitable thickness, but typically has a thickness between about 10 Å and about 1000 Å, preferably between about 25 Å and about 100 Å.

Figure 2G:
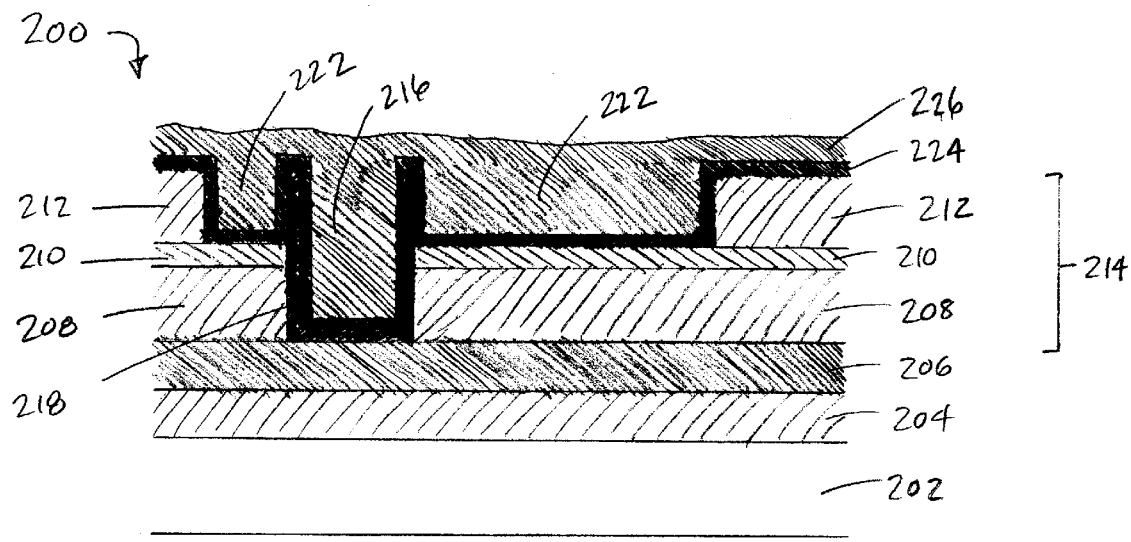

FIG. 2G shows a cross sectional view of the wafer stack 200 after a metal layer 226 has been deposited. Metal layer 226 is deposited over liner 224 so that trench 222 and via 216 are both filled, preferably entirely, with metal layer 226. Metal layer 226 may be formed of any suitable metal such as Al, Cu, W, Au, Ag, or alloys thereof. Metal layer 226 may be deposited using any suitable metallization process such as CVD, PECVD, PVD, sputter deposition, electroplating or electroless plating.

Figure 2H:
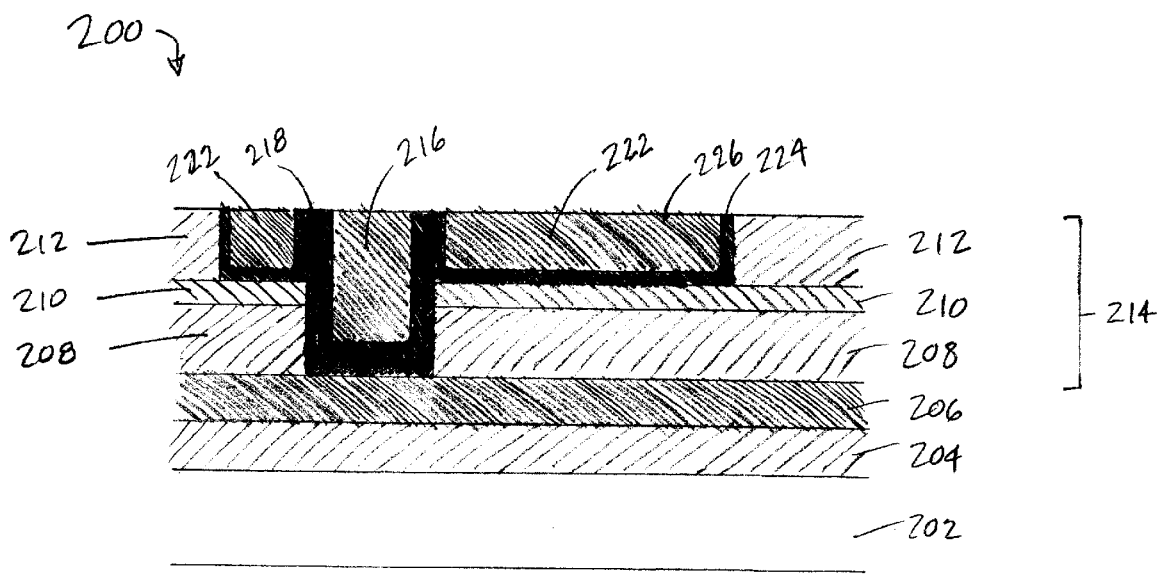

FIG. 2H shows a cross sectional view of the wafer stack 200 after that portion of metal layer 226 and liner 224 above the top surface of dielectric layer 214 has been removed. Metal layer 226 and liner 224 above the top surface of dielectric layer 214 may be removed by any suitable means, such as by a CMP process. The planarization of metal layer 226 and liner 224 results in the formation of metal line 222 and via 216 that serves as an interconnect to metal layer 206. The next device level can then be formed, or a cap layer can be deposited over the wafer stack 200.

Figure 2I:
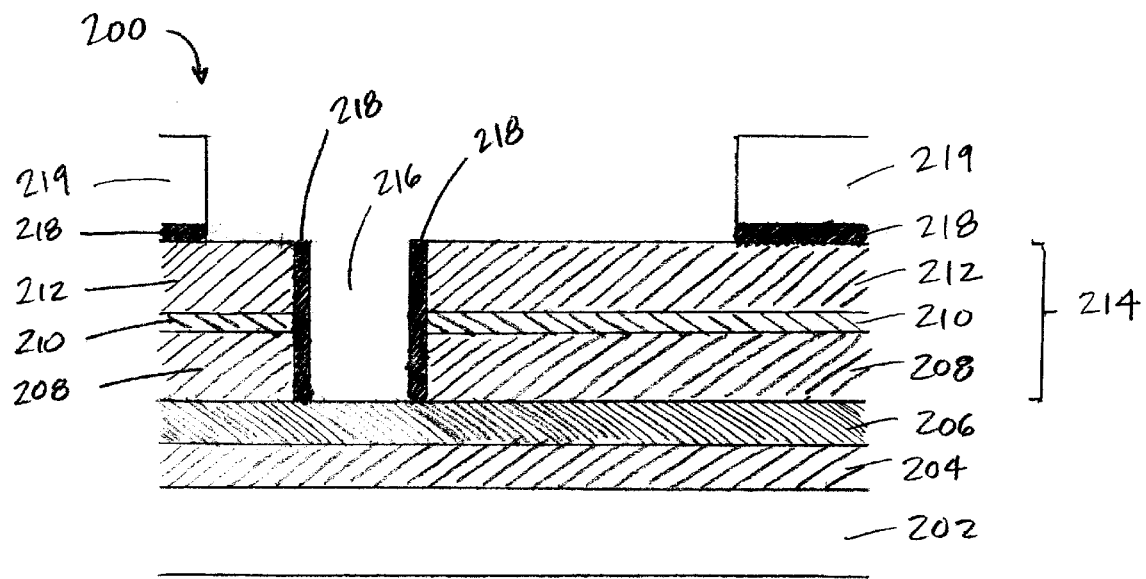

FIGS. 2A–2C and 2I–2L illustrate an alternative embodiment in which only a portion of via liner 218 above the top of dielectric layer 214 is removed prior to forming trench 222. As discussed previously, FIG. 2C shows a cross sectional view of the wafer stack 200 after via liner 218 has been deposited. FIG. 2I shows a cross sectional view of the wafer stack 200 after a portion of via liner 218 has been removed. Specifically, that portion of liner 218 on the bottom horizontal surface of via 216, and that portion of liner 218 on the top surface of dielectric layer 214 which corresponds to the desired line location, have been removed. Liner 218 may be removed using a photolithography process wherein a photoresist layer 219 is spin-coated and patterned over liner 218 to form a photomask through exposure and development using, for example, deep UV light. Liner 218 is then removed using a directional etching process, such as a RE process with $CHF_3$, $O_2$, Ar and CO. By using a directional etching process, only those portions of liner 218 on the horizontal surfaces, i.e., on the exposed portion of the top surface of dielectric layer 214 and on the bottom surface of via 216, are removed. Any removal of the vertical portions of liner 218 is minimal.

Figure 2J:
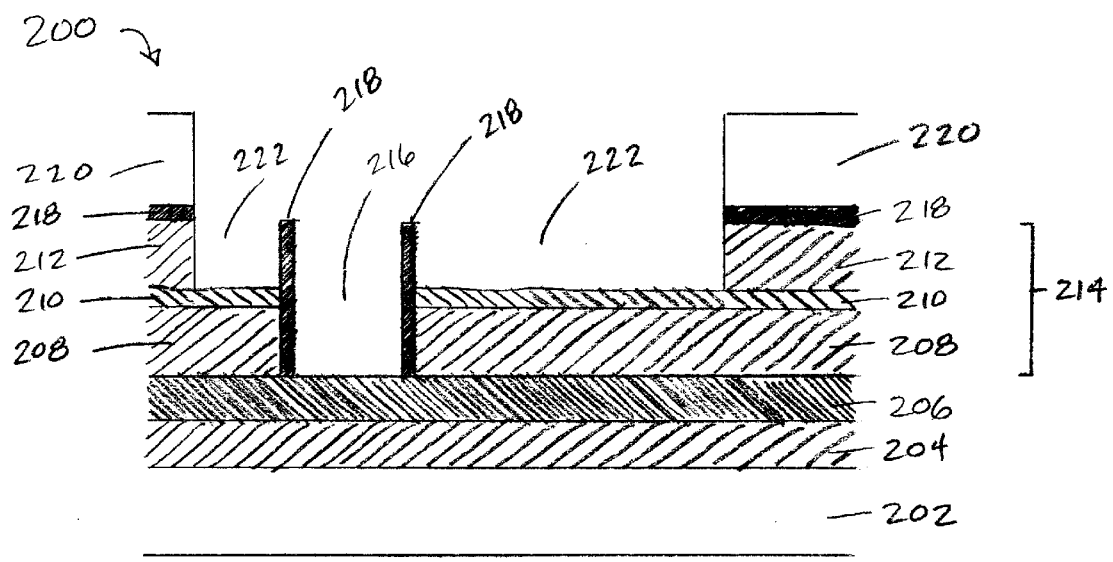

FIG. 2J shows a cross sectional view of the wafer stack 200 after a portion of dielectric layer 214 has been removed to form a trench 222. The trench may be formed using any suitable etching process. For example, trench 222 may be formed using a photolithography process wherein a photoresist layer 220 is spin-coated and patterned over liner 218 to form a photomask through exposure and development using, for example, deep UV light. The photoresist used in photoresist layer 220 may be the same or different from the photoresist used in photoresist layer 219. Moreover, if the same photoresist is used in layers 219 and 220, the photoresist need not be stripped or cleaned from the wafer stack 200 after etching liner 218. That is, the same photomask may be used for etching of liner 218, and for etching of dielectric layer 214 to form trench 222. When etching dielectric layer 214, an etching process which is selective to liner 218 must be used. If dielectric layer 214 includes oxide layer 208, hardmask layer 210 and oxide layer 212, an etching process which is selective to hardmask layer 210 should be used such that a portion of oxide layer 212 is etched down to hardmask layer 210 to form trench 222. For example, oxide layer 212 may be etched using a RIE process with $C_4F_8$, CO and Ar. If no hardmask layer 210 is used, dielectric layer 214 is partially etched through using a timed process. After trench 222 has been formed, photoresist layer 220 and any etch residue are removed by a suitable stripping and cleaning process.

Again, it is important to note that in this process the photomasks formed by exposure and development of photoresist layers 219 and 220 need not mask the via area 216 on the wafer stack 200. In other words, the photomask pattern may have an opening which corresponds to the full line area including that area which overlays the via area. Thus, a photolithography process with an overlay tolerance much greater than the thickness of liner 218 may be used in this process.

Figure 2K:
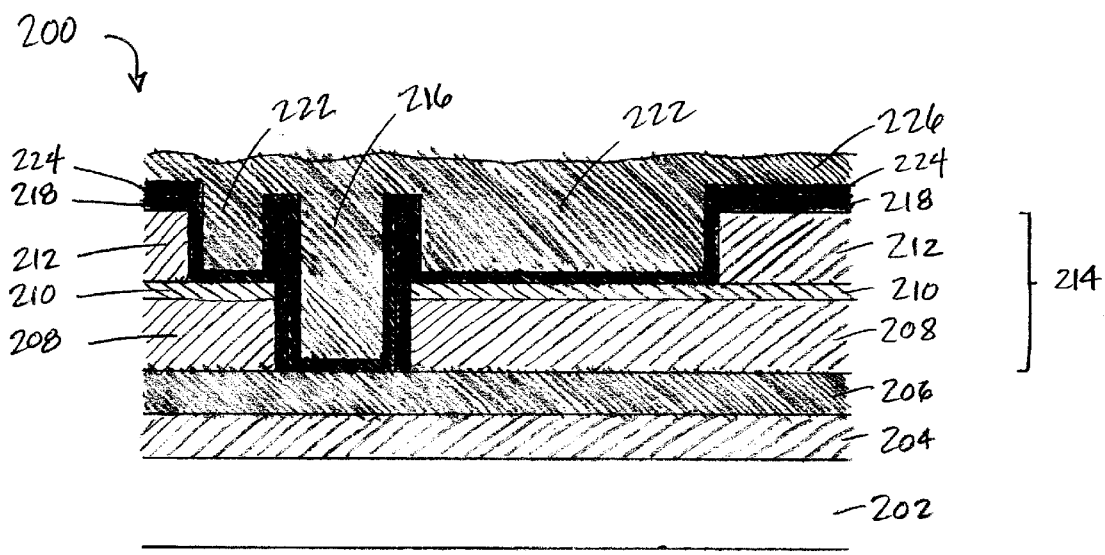

FIG. 2K shows a cross sectional view of the wafer stack 200 after a second liner 224 has been deposited, and after a metal layer 226 has been deposited. Liner 224 is deposited in a conformal manner over first liner 218, in trench 222 and in via 216. Metal layer 226 is then deposited over liner 224 so that trench 222 and via 216 are both filled, preferably entirely, with metal layer 226.

Figure 2L:
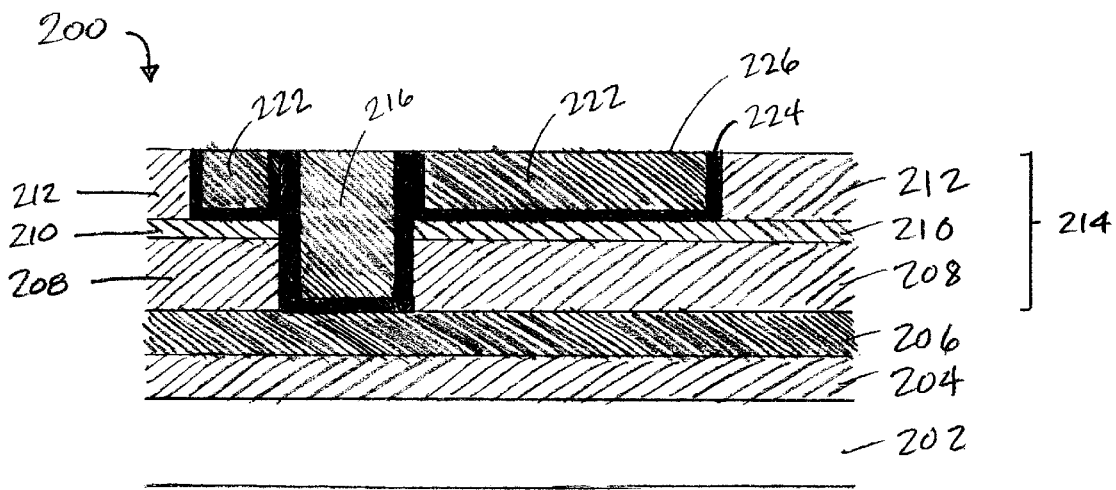

FIG. 2L shows a cross sectional view of the wafer stack 200 after that portion of metal layer 226 and liner 224 above the top surface of dielectric layer 214 has been removed by any suitable means, such as by a CMP process.

Figure 3A:
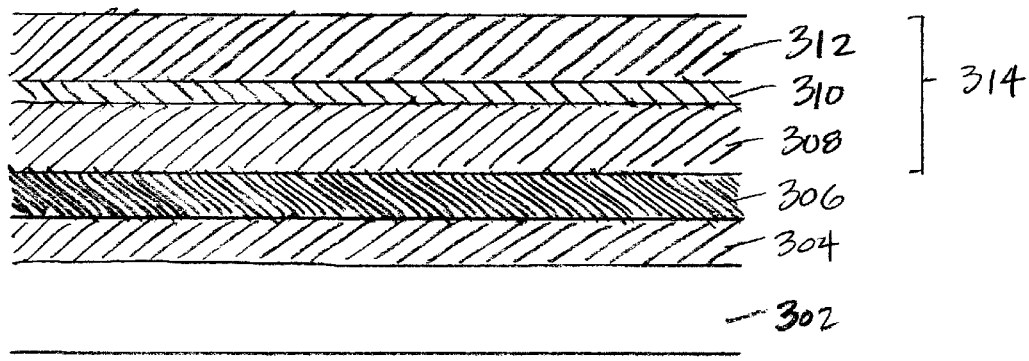
FIGS. 3A–3F illustrate a second embodiment of the present invention wherein a partial via is formed first.

FIGS. 3A–3F illustrate a variation on the previously described embodiment wherein a partial via is formed first, and then the trench and the remainder of the via are subsequently formed. FIG. 3A shows a cross sectional view of a partially fabricated wafer stack 300. A metal layer 306 is first deposited over a substrate 302. A dielectric layer 304 may be formed over substrate 302 prior to depositing metal layer 306. Next, a dielectric layer 314 is formed over metal layer 306. Dielectric layer 314 may comprise a first oxide layer 308, a hardmask layer 310, and a second oxide layer 312.

Metal layer 306 may be deposited using any suitable process such as CVD, PECVD, PVD, sputter deposition, electroplating and electroless plating, or by any other known metallization technique or combination of known metallization techniques. Metal layer 306 may be formed of any suitable metal such as Al, Cu, W, Au, Ag, or alloys thereof.

It should be appreciated that other additional layers above, below or between dielectric layer 304 and metal layer 306 may be present. For example, a conductive liner typically formed of Ti, TiN,W, TiW, Ta, TaN or other suitable materials may be deposited between dielectric layer 304 and metal layer 306.

Dielectric layer 314 may be formed over metal layer 306 by any suitable process such as CVD, PECVD, PVD, high density plasma CVD or spin-on glass process. Dielectric layer 314 may be formed from any material capable of functioning as an insulating passivation layer, including inorganic dielectric materials such as $SiO_2$, FSG, silicon nitride and diamond-like carbon; organic or polymeric dielectric materials such as polyimide, parylene, polytetraflouroethylene, and polymer-based low-k dielectric materials such as Dow SiLK™ and Dow Cyclotene™; silicon-containing organic dielectric materials such as benzocyclobutene; and nano-pore containing materials.

Dielectric layer 314 may comprise a first oxide layer 308, a hardmask layer 310, and a second oxide layer 312. Oxide layers 308 and 312 may be formed of an oxide such as silicon dioxide. Hardmask layer 310 may be formed of any material capable of functioning as an etch stop layer, such as $Si_3N_4$ or $SiO_xN_y$. Oxide layers 308 and 312 may be of any suitable thickness, but typically have a thickness between about 0.2 µm and about 1 µm. Hardmask layer 310 also may be of any suitable thickness, but typically has a thickness between about 50 Å and about 500 Å.

Figure 3B:
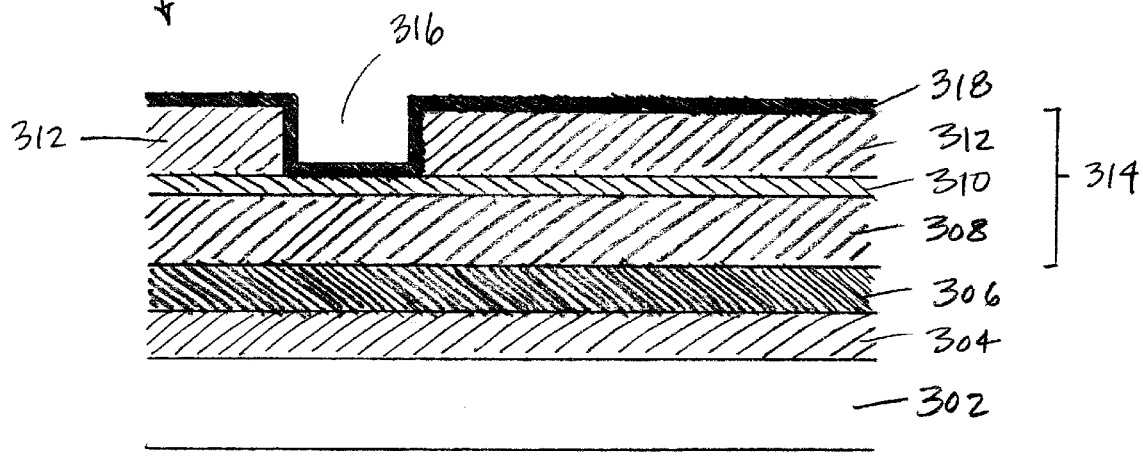

FIG. 3B shows a cross sectional view of the wafer stack 300 after a partial via 316 has been formed in dielectric layer 314, and after a first liner 318 has been deposited. Via 316 may be formed using any suitable etching process. For example, via 316 may be formed using a photolithography process wherein a photoresist layer (not shown) is spin-coated and patterned over dielectric layer 314 to form a photomask through exposure and development using, for example, deep ultra-violet (UV) light. The photomask serves to define the etching location or portion over dielectric layer 314. Dielectric layer 314 is then partially etched through. Any suitable etching process may be used, such as RE. If dielectric layer 314 includes oxide layer 308, hardmask layer 310 and oxide layer 312, an etching process is used which is selective to hardmask layer 310. For example, oxide layer 312 may be etched using a RIE process with $C_4F_8$, CO and Ar. If no hardmask layer 310 is used, dielectric layer 314 is partially etched through using a timed process. After etching partial via 316, the photoresist layer and any etch residue are removed by a suitable stripping and cleaning process.

Liner 318 is then deposited in a conformal manner over dielectric layer 314 and partial via 316. Any material suitable for preventing adverse effects (e.g., pitting, spiking, diffusion) from contact between a dielectric layer and a metal layer may be used in liner 318. Typically, liner 318 comprises one or more metals such as Ti, TiN, Ta, TaN, W, TiW, TaSiN, WN, or any other refractory metals and their nitrides. Liner 318 may be deposited by any suitable process, such as by sputter deposition, CVD, PVD or iPVD. Liner 318 may be of any suitable thickness, but typically has a thickness between about 10 Å and about 1000 Å, preferably between about 25 Å and about 100 Å.

Figure 3C:
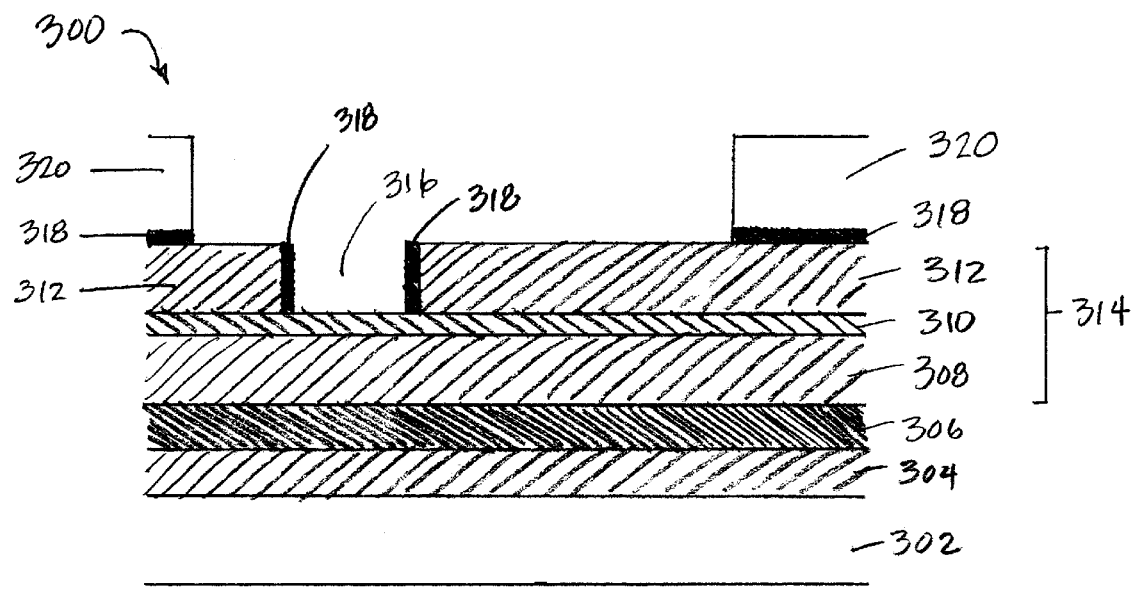

FIG. 3C illustrates a cross sectional view of the wafer stack 300 after a portion of liner 318 has been removed. Specifically, that portion of liner 318 on the bottom horizontal surface of partial via 316, and that portion of liner 318 on the top surface of dielectric layer 314 which corresponds to the desired line location, have been removed. Liner 318 may be removed using a photolithography process wherein a photoresist layer 320 is spin-coated and patterned over liner 318 to form a photomask through exposure and development using, for example, deep UV light. Liner 318 is then removed using a directional etching process, such as a RE process with $CHF_3$, $O_2$, Ar and CO. By using a directional etching process, only those portions of liner 318 on the horizontal surfaces, i.e., on the top surface of dielectric layer 314 and on the bottom surface of partial via 316, are removed. Any removal of the vertical portions of liner 318 is minimal.

Figure 3D:
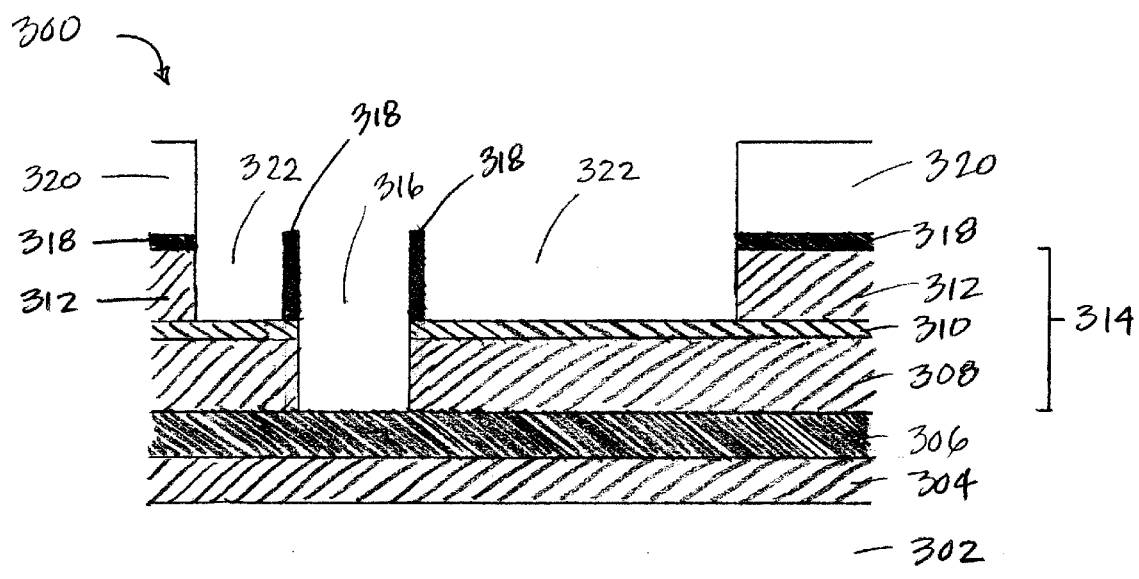

FIG. 3D shows a cross sectional view of the wafer stack 300 after a portion of dielectric layer 314 has been removed to form trench 322 and the remainder of via 316. Trench 322 and the remainder of via 316 may be formed using any suitable etching process. For example, trench 322 and via 316 may be formed using a photolithography process wherein photoresist layer 320 was previously spin-coated and patterned over liner 318 to form a photomask through exposure and development using, for example, deep UV light. Dielectric layer 314 is then etched to a desired depth to form trench 322 and via 316. An etching process which is selective to liner 318 must be used. If dielectric layer 314 includes oxide layer 308, hardmask layer 310 and oxide layer 312, a two-step etching process is used wherein the exposed portion of the hardmask 310 in the-partial via 316 is first removed, and then oxide layers 308 and 312 in via 316 and trench 322, respectively, are removed. For example, hardmask layer 310 may be etched using a directional RIE process with $CHF_3$, $O_2$, Ar and optionally CO, and then oxide layers 308 and 312 may be removed using a RIE process with $C_4F_8$, CO and Ar. If no hardmask layer 310 is used, dielectric layer 314 is etched using a timed process. After forming trench 322 and the remainder of via 316, the photoresist layer and any etch residue are removed by a suitable stripping and cleaning process.

It is important to note that in this process the photomask formed by exposure and development of photoresist layer 320 need not mask the via area 316 on the wafer stack 300. In other words, the photomask pattern may have an opening which corresponds to the full line area including that area which overlays the via area. Thus, a photolithography process with an overlay tolerance much greater than the thickness of liner 318 may be used in this process.

Figure 3E:
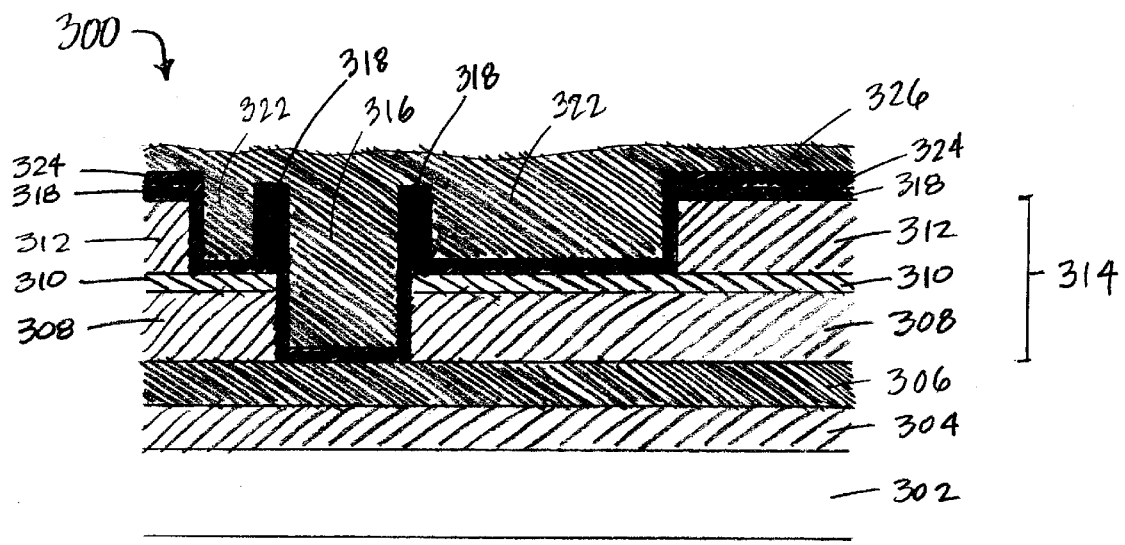

FIG. 3E shows a cross sectional view of the wafer stack 300 after a second liner 324 has been deposited, and after a metal layer 326 has been deposited. Liner 324 is deposited in a conformal manner over first liner 318, in trench 322 and in via 316. Any material suitable for preventing adverse effects (e.g., pitting, spiking, diffusion) from contact between a dielectric layer and a metal layer may be used in liner 324. Typically, liner 324 comprises one or more metals such as Ti, TiN, Ta, TaN, W, TiW, TaSiN, WN, or any other refractory metals and their nitrides. Liner 324 may be deposited by any suitable process, such as by sputter deposition, CVD, PVD or iPVD. Liner 324 may be of any suitable thickness, but typically has a thickness between about 10 Å and about 1000 Å, preferably between about 25 Å and about 100 Å.

Metal layer 326 is then deposited over liner 324 so that trench 322 and via 316 are both filled, preferably entirely, with metal layer 326. Metal layer 326 may be formed of any suitable metal such as Al, Cu, W, Au, Ag, or alloys thereof. Metal layer 326 may be deposited using any suitable metallization process such as CVD, PECVD, PVD, sputter deposition, electroplating or electroless plating.

Figure 3F:
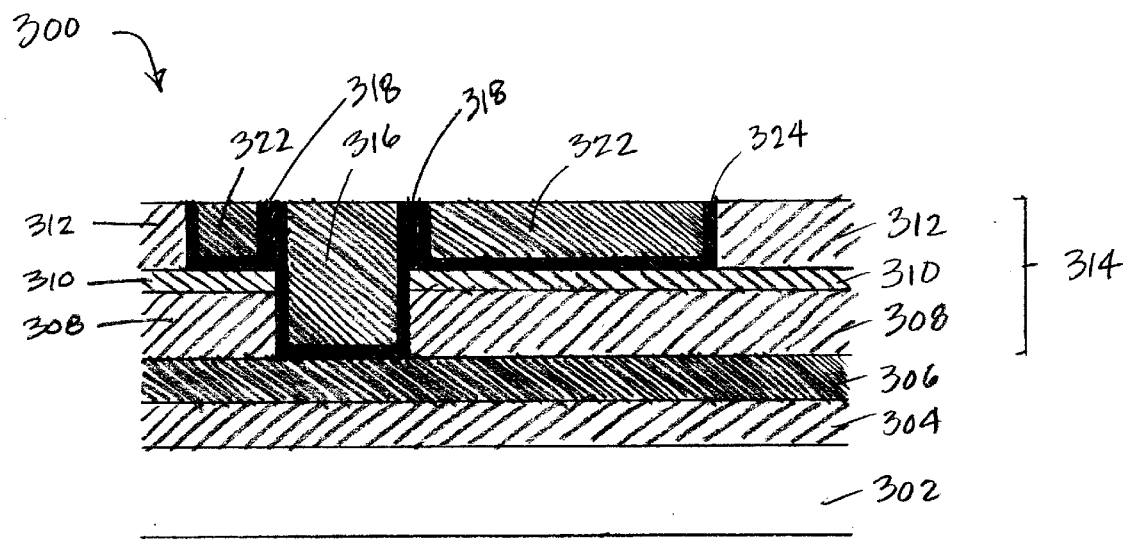

FIG. 3F shows a cross sectional view of the wafer stack 300 after that portion of metal layer 326 and liners 318 and 324 above the top surface of dielectric layer 314 has been removed by any suitable means, such as by a CMP process. The planarization of metal layer 326 and liners 318 and 324 results in the formation of metal line 322 and via 316 that serves as an interconnect to the metal layer 306. The next device level can then be formed, or a cap layer can be deposited over the wafer stack 300.

Figure 3G:
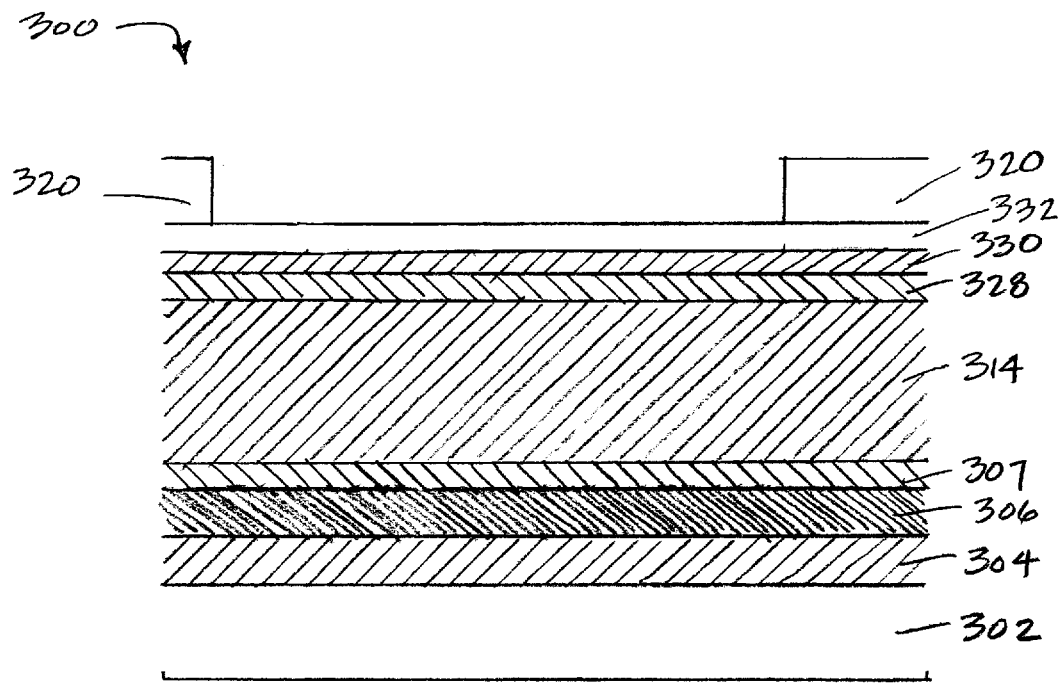
FIGS. 3G–3J illustrate an alternative to the second embodiment of the present invention wherein a partial via is formed first.

FIGS. 3G–3J illustrate an alternative variation on the method described in relation to FIGS. 3A–3H. FIG. 3G shows a cross sectional view of a partially fabricated wafer stack 300. A metal layer 306 is first deposited over a substrate 302. A dielectric layer 304 may be formed over substrate 302 prior to depositing metal layer 306. A hardmask layer 307 may also be formed over metal layer 306. Next, a dielectric layer 314 is formed over metal layer 306. Hardmask layers 328 and 330 are next deposited over dielectric layer 314. Hardmask layers 328 and 330 may be referred to collectively as a bi-layer hardmask (BLHM).

Hardmask layer 307 may be formed from a nitride such as $Si_3N_4$. Dielectric layer 314 may comprise a polymer-based low-k dielectric material such as Dow SiLK™. Hardmask layers 328 and 330 may be formed from materials toward which a RIE process for etching dielectric layer 314 shows a high selectivity, such as $SiO_2$ or $Si_3N_4$.

Organic dielectric materials such as Dow SiLK™ often behave like photoresist during plasma etching processes. Therefore, hardmask layers such as hardmask layers 328 and 330 are used so that photoresist may be stripped without damaging the underlying dielectric material, as discussed by R. D. Goldblatt et al. in the article "A High Performance 0.13 μm Copper BEOL Technology with Low-k Dielectric" published in The Proceedings of the 2000 International Interconnect Technology Conference, pp. 261–263, the disclosure of which is incorporated herein by reference.

An anti-reflective coating (ARC) 332 is deposited over hardmask layers 328 and 330, and a photoresist later 320 is deposited over ARC 332. In FIG. 3G, a line pattern has been transferred to photoresist layer 320 through exposure and development in a conventional photolithography process.

Figure 3H:
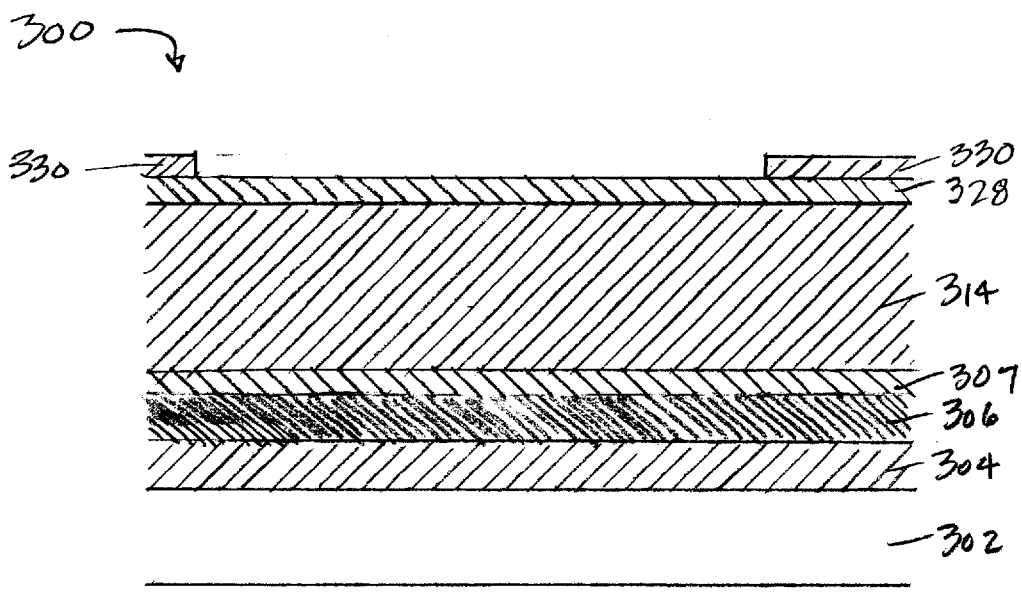

FIG. 3H shows a cross sectional view of wafer stack 300 after the line pattern has been etched into hardmask layer 330, and photoresist layer 320 and ARC 332 have been removed through a suitable stripping and cleaning process. The etching process used to etch hardmask layer 330 should be selective to hardmask layer 328.

Figure 3I:
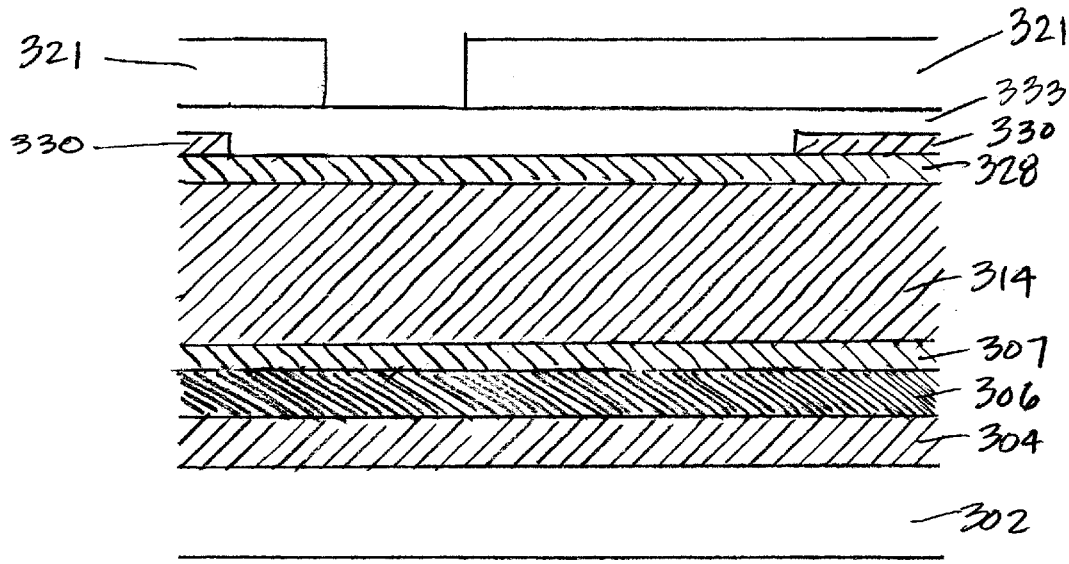

FIG. 3I shows a cross sectional view of wafer stack 300 after ARC 333 has been deposited over hardmask layers 328 and 330, and photoresist layer 321 has been deposited over ARC 333. A via pattern has been transferred to photoresist layer 321 through exposure and development in a conventional photolithography process.

Figure 3J:
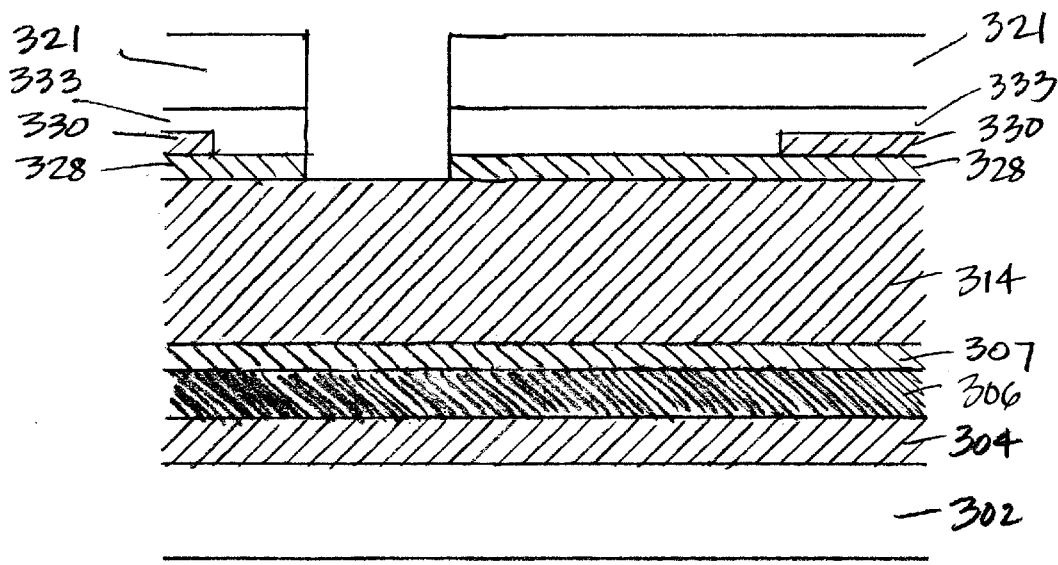

FIG. 3J shows a cross sectional view of wafer stack 300 after the via pattern has been etched into hardmask layer 328. Photoresist layer 321 and ARC 333 remain on wafer stack 300 for use in subsequent etching of dielectric layer 314 to form a via. The etching process used to etch hardmask layer 328 should be selective to dielectric layer 314, as well as to photoresist layer 321 and ARC 333.

After the line pattern has been transferred to hardmask layer 330 and the via pattern has been transferred to hardmask layer 328, the remainder of the processing steps described in relation to FIGS. 3B–3F may be performed. In particular, a partial via may be formed and a liner may be deposited as described in relation to FIG. 3B. When dielectric layer 314 is etched to form the partial via, photoresist layer 321 and ARC 333 are typically consumed. Next, hardmask layer 328 may be opened using an etching process which is selective to the other layers remaining on wafer stack 300. Then, a trench and the remainder of the via may be formed as described in relation to FIGS. 3C–3D. A second liner may be deposited over the trench and via, and the trench and via may be filled with a metal layer, as described in relation to FIG. 3E. Prior to liner deposition and metal fill, one or both of hardmask layers 328 and 330 may be removed. Finally, the excess metal layer and metal liners above the dielectric layer may be removed in a planarization process, as described in relation to FIG. 3F. Those skilled in the art will appreciate that when using this hardmask approach, each etching step should be selective to the other layers remaining on the wafer stack. Those skilled in the art also will appreciate that this hardmask approach can be used in conjunction with the embodiments described in relation to FIGS. 2A–2L, wherein the full via is formed first.

Figure 4A:
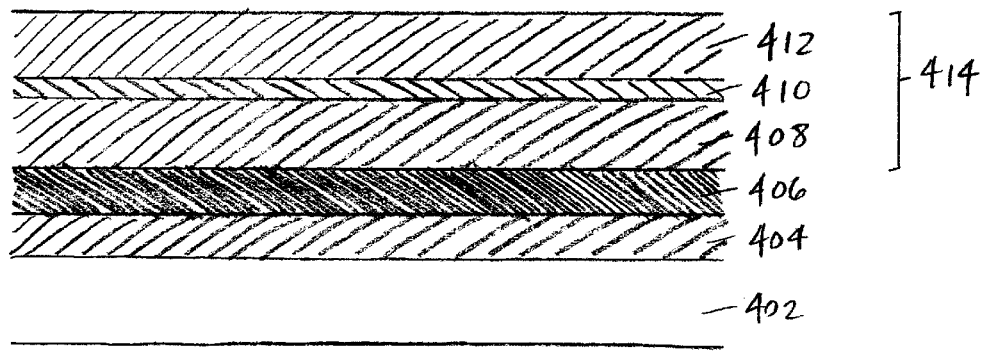
FIGS. 4A–4F illustrate a third embodiment of the present invention wherein the trench is formed first.

FIGS. 4A–4F illustrate another embodiment of the present invention wherein the trench is formed first. FIG. 4A shows a cross sectional view of a partially fabricated wafer stack 400. A metal layer 406 is first deposited over a substrate 402. A dielectric layer 404 may be formed over substrate 402 prior to depositing metal layer 406. Next, a dielectric layer 414 is formed over metal layer 406. Dielectric layer 414 may comprise a first oxide layer 408, a hardmask layer 410, and a second oxide layer 412.

Metal layer 406 may be deposited using any suitable process such as CVD, PECVD, PVD, sputter deposition, electroplating and electroless plating, or by any other known metallization technique or combination of known metallization techniques. Metal layer 406 may be formed of any suitable metal such as Al, Cu, W, Au, Ag, or alloys thereof.

It should be appreciated that other additional layers above, below or between dielectric layer 404 and metal layer 406 may be present. For example, a conductive liner typically formed of Ti, TIN,W, TiW, Ta, TaN or other suitable materials may be deposited between dielectric layer 404 and metal layer 406.

Dielectric layer 414 may be formed over metal layer 406 by any suitable deposition process such as CVD, PECVD, PVD, high density plasma CVD or spin-on glass process. Dielectric layer 414 may be formed from any material capable of functioning as an insulating passivation layer, including inorganic dielectric materials such as $SiO_2$, FSG, silicon nitride and diamond-like carbon; organic or polymeric dielectric materials such as polyimide, parylene, polytetraflouroethylene, and polymerbased low-k dielectric materials such as Dow SiLK™ and Dow Cyclotene™ silicon-containing organic dielectric materials such as benzocyclobutene; and nano-pore containing materials.

Dielectric layer 414 may comprise a first oxide layer 408, a hardmask layer 410, and a second oxide layer 412. Oxide layers 408 and 412 may be formed of an oxide such as silicon dioxide. Hardmask layer 410 may be formed of any material capable of functioning as an etch stop layer, such as $Si_3N_4$ or $SiO_xN_y$. Oxide layers 408 and 412 may be of any suitable thickness, but typically have a thickness between about 0.2 μm and about 1 μm. Hardmask layer 410 also may be of any suitable thickness, but typically has a thickness between about 50 Å and about 500 μ.

Figure 4B:
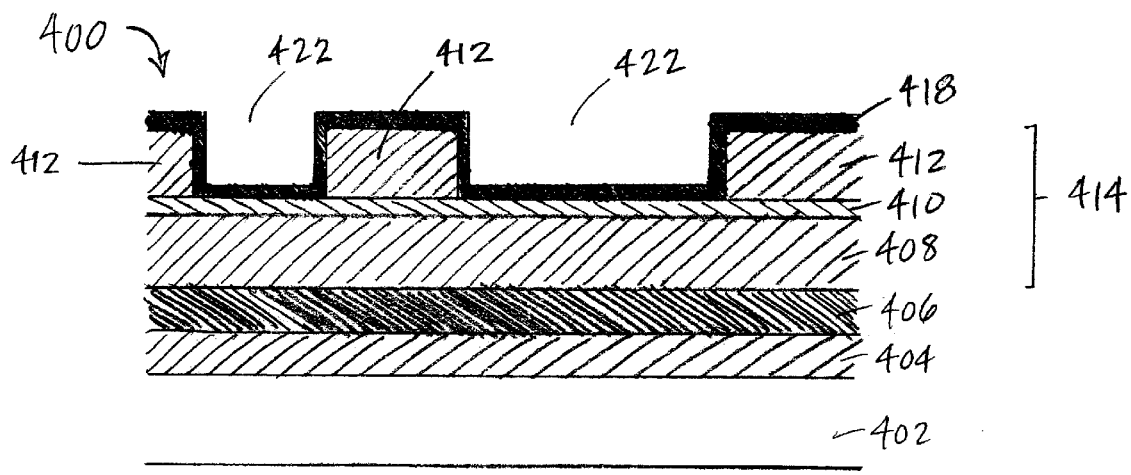

FIG. 4B shows a cross sectional view of the wafer stack 200 after a trench 422 has been formed in dielectric layer 414, and after a first liner 418 has been deposited. The size and location of trench 422 corresponds to that of the desired line, except that the portion of the line area which overlies the desired location for the via is not etched.

Trench 422 may be formed using any suitable etching process. For example, trench 422 may be formed using a photolithography process wherein a photoresist layer (not shown) is spin-coated and patterned over dielectric layer 414 to form a photomask through exposure and development using, for example, deep UV light. The photomask serves to define the etching location or portion over dielectric layer 414. Dielectric layer 414 is then partially etched through to form trench 422. If dielectric layer 414 includes oxide layers 408 and 412 and hardmask layer 410, then an etching process is used which is selective to hardmask layer 410, and oxide layer 412 is etched through to expose a portion of hardmask layer 410. If no hardmask 410 is used, then dielectric layer 414 is partially etched through using a timed process. Any suitable etching process may be used, such as RIE. After forming trench 422, the photoresist layer and any etch residue are removed by a suitable stripping and cleaning process.

A liner 418 is then deposited in a conformal manner over dielectric layer 414 and trench 422. Any material suitable for preventing adverse effects (e.g., pitting, spiking, diffusion) from contact between a dielectric layer and a metal layer may be used in liner 418. Typically, liner 418 comprises one or more metals such as Ti, TiN, Ta, TaN, W, TiW, TaSiN, WN, or any other refractory metals and their nitrides. Liner 418 may be deposited by any suitable process, such as by sputter deposition, CVD, PVD or iPVD. Liner 418 may be of any suitable thickness, but typically has a thickness between about 10 Å and about 1000 Å, preferably between about 25 Å and about 100 Å.

Figure 4C:
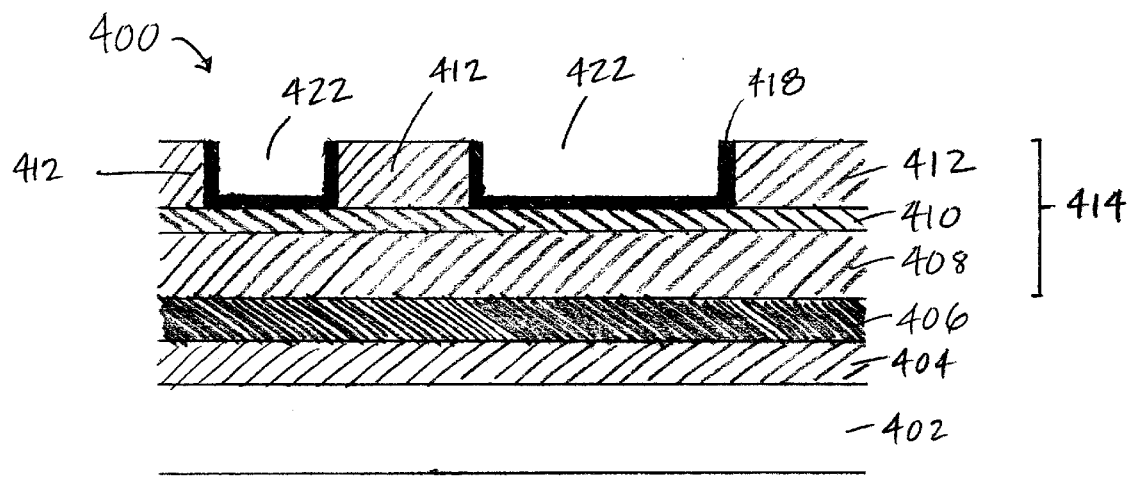

FIG. 4C shows a cross sectional view of the wafer stack 400 after that portion of liner 418 above the top surface of dielectric layer 414 has been removed by a planarization process such as by a CMP process.

Figure 4D:
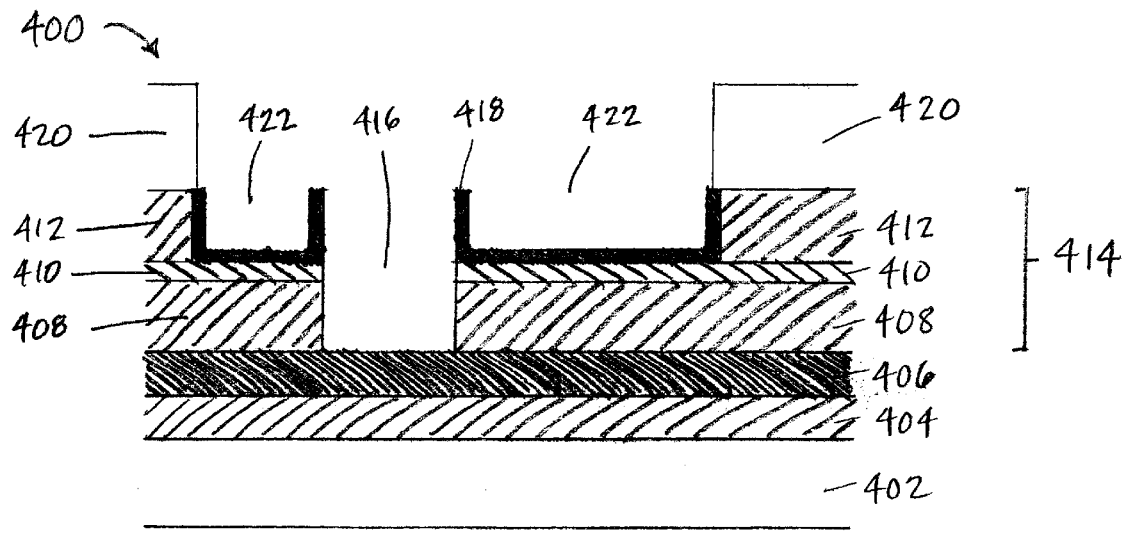

FIG. 4D shows a cross sectional view of the wafer stack 400 after a via 416 has been formed. Via 416 may be formed using any suitable etching process. For example, via 416 may be formed using a photolithography process wherein a photoresist layer 420 is spin-coated and patterned over dielectric layer 414 to form a photomask through exposure and development using, for example, deep UV light. The photomask serves to define the via location or portion of dielectric layer 414 to be etched. Dielectric layer 414 is then etched through to expose a portion of metal layer 406.

It is important to note that the photomask formed by photoresist layer 420 need not mask the trench areas 422 on the wafer stack 400. In other words, the photomask pattern may have an opening whose edges correspond to the edges of the desired via, or the photomask pattern may have an opening whose edges are wider than the edges of the desired via. The photomask pattern may even have an opening whose edges correspond to the edges of the desired line location, as shown in FIG. 4D. Thus, a photolithography process with a relatively large overlay tolerance may be used in this process.

Figure 4E:
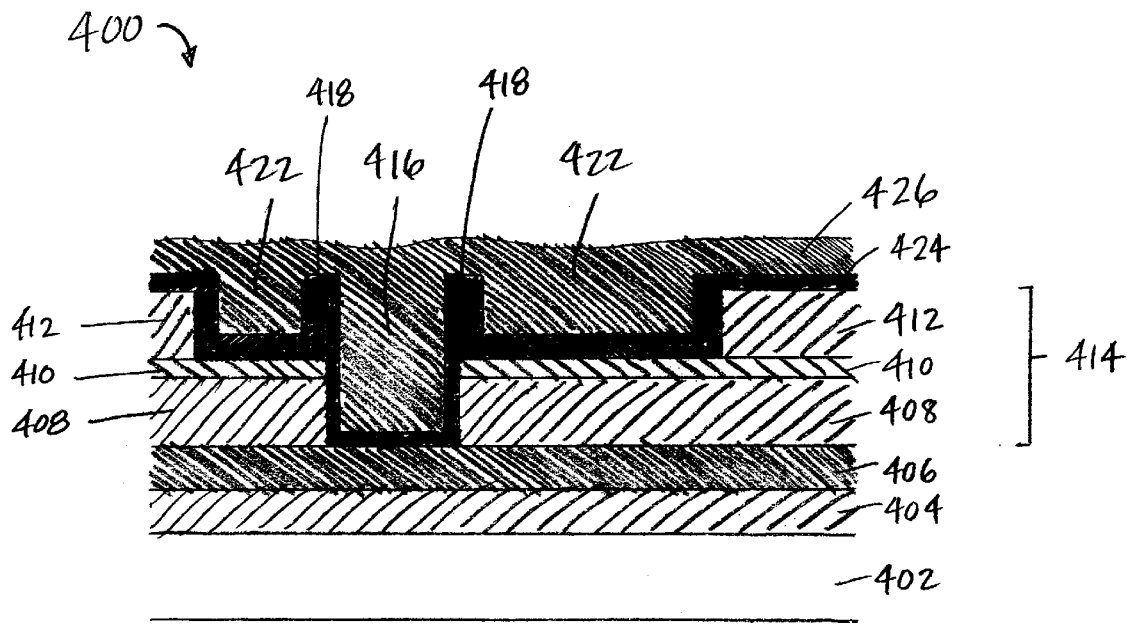

FIG. 4E shows a cross sectional view of the wafer stack 400 after a second liner 424 has been deposited, and after a metal layer 426 has been deposited. Liner 424 is deposited in a conformal manner over dielectric layer 414, trench 422, via 416 and first liner 418. Any material suitable for preventing adverse effects (e.g., pitting, spiking, diffusion) from contact between a dielectric layer and a metal layer may be used in liner 424. Typically, liner 424 comprises one or more metals such as Ti, TiN, Ta, TaN, W, TiW, TaSiN, WN, or any other refractory metals and their nitrides. Liner 424 may be deposited by any suitable process, such as by sputter deposition, CVD, PVD or iPVD. Liner 424 may be of any suitable thickness, but typically has a thickness between about 10 Å and about 1000 Å, preferably between about 25 Å and about 100 Å.

Metal layer 426 is then deposited over liner 424 so that trench 422 and via 416 are both filled, preferably entirely, with metal layer 426. Metal layer 426 may be formed of any suitable metal such as Al, Cu, W, Au, Ag, or alloys thereof. Metal layer 426 may be deposited using any suitable metallization process such as CVD, PECVD, PVD, sputter deposition, electroplating or electroless plating.

Figure 4F:
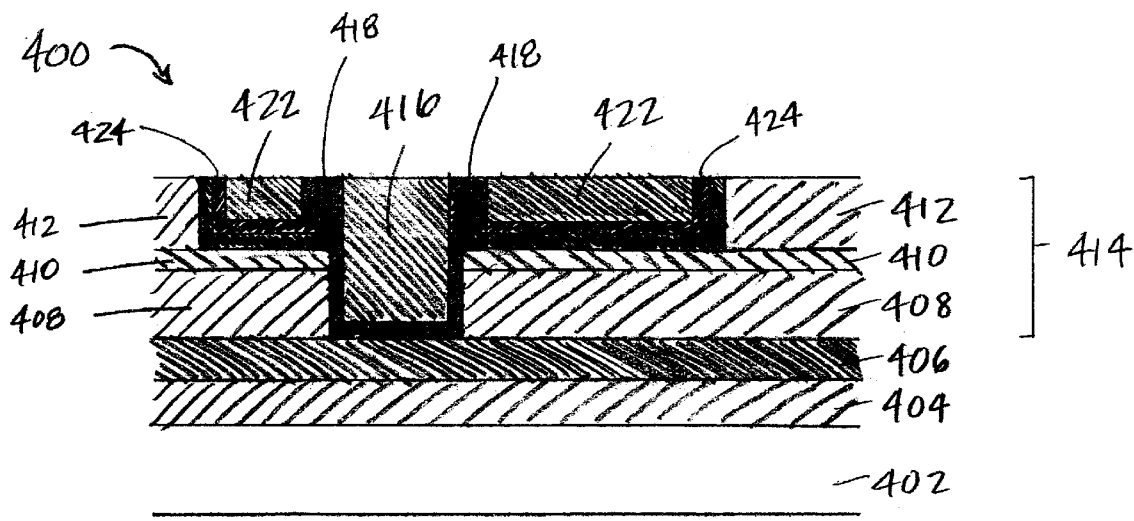

FIG. 4F shows a cross sectional view of the wafer stack 400 after that portion of metal layer 426 and liner 424 above the top surface of dielectric layer 414 has been removed by any suitable means, such as by a CMP process. The planarization of metal layer 426 and liner 424 results in the formation of metal line 422 and via 416 that serves as an interconnect to the metal layer 406. The next device level can then be formed, or a cap layer can be deposited over the wafer stack 400.

Those skilled in the art will appreciate that the hardmask approach described in relation to FIGS. 3I–3J can also be used in conjunction with this embodiment wherein the trench is formed first.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. A process for enclosing a via in a semiconductor device, the process comprising the steps of:

forming a dielectric layer over a first metal layer, wherein the dielectric layer has a thickness;

forming a via in the dielectric layer, wherein the via has a depth at least equal to the thickness of the dielectric layer, thereby defining a sidewall of the dielectric layer and exposing a portion of the first metal layer;

conformally depositing a first metal liner in the via, wherein the first metal liner includes a bottom portion deposited over said exposed portion of the first metal layer and a sidewall portion deposited over said sidewall of the dielectric layer;

forming at least one trench in the dielectric layer adjacent to the first metal liner, wherein the trench has a depth less than the thickness of the dielectric layer, thereby defining a trench bottom and a trench sidewall and exposing an upper portion of said sidewall portion of the first metal liner;

conformally depositing a second metal liner in the trench, wherein at least a portion of the second metal liner is deposited over the trench bottom and the trench sidewall; and depositing a second metal layer over the first metal liner and the second metal liner, wherein the second metal layer substantially fills the via and the trench.

2. The process of claim 1 wherein the first metal layer comprises a material selected from the group consisting of aluminum, copper, tungsten, gold, silver and alloys thereof.

3. The process of claim 1 wherein the dielectric layer is formed by a process selected from the group consisting of chemical vapor deposition, plasma enhanced chemical vapor deposition, physical vapor deposition, high density plasma chemical vapor deposition and spin-on glass deposition.

4. The process of claim 1 wherein the dielectric layer comprises a material selected from the group consisting of silicon dioxide, fluorosilicate glass, silicon nitride, diamond-like carbon, polyimide, parylene, polytetrafluoroethylene, a polymer-based low-k dielectric material, benzocyclobutene, and a nano-pore containing material.

5. The process of claim 1 wherein the thickness of the dielectric layer is between about 0.4 micron and about 2 microns.

6. The process of claim 1 wherein the dielectric layer comprises a first oxide layer, a hardmask layer, and a second oxide layer.

7. The process of claim 6 wherein the first oxide layer and the second oxide layer are each formed of silicon dioxide.

8. The process of claim 6 wherein the hardmask layer is formed of a material selected from the group consisting of silicon nitride and silicon oxynitride.

9. The process of claim 6 wherein the first oxide layer and the second oxide layer each have a thickness between about 0.2 micron and about 1 micron.

10. The process of claim 6 wherein the hardmask layer has a thickness between about 50 angstroms and about 500 angstroms.

11. The process of claim 1 wherein the via is formed using a photolithography process.

12. The process of claim 1 wherein the first metal liner comprises a refractory metal or a refractory metal nitride.

13. The process of claim 1 wherein the first metal liner comprises a material selected from the group consisting of titanium, titanium nitride, tantalum, tantalum nitride, tungsten, titanium tungsten, titanium silicon nitride, tungsten nitride and alloys thereof.

14. The process of claim 1 wherein the first metal liner is deposited using a process selected from the group consisting of sputter deposition, chemical vapor deposition, physical vapor deposition and ionized physical vapor deposition.

15. The process of claim 1 wherein the first metal liner has a thickness between about 10 angstroms and about 1000 angstroms.

16. The process of claim 15 wherein the first metal liner has a thickness between about 25 angstroms and about 100 angstroms.

17. The process of claim 1 wherein the trench is formed using a photolithography process.

18. The process of claim 17 wherein the photolithography process is selective to the first metal liner.

19. The process of claim 1 wherein the second metal liner comprises a refractory metal or a refractory metal nitride.

20. The process of claim 1 wherein the second metal liner comprises a material selected from the group consisting of titanium, titanium nitride, tantalum, tantalum nitride, tungsten, titanium tungsten, titanium silicon nitride, tungsten nitride and alloys thereof.

21. The process of claim 1 wherein the second metal liner is deposited using a process selected from the group consisting of sputter deposition, chemical vapor deposition, physical vapor deposition and ionized physical vapor deposition.

22. The process of claim 1 wherein the second metal liner has a thickness between about 10 angstroms and about 1000 angstroms.

23. The process of claim 22 wherein the second metal liner has a thickness between about 25 angstroms and about 100 angstroms.

24. The process of claim 1 wherein the second metal layer comprises a material selected from the group consisting of aluminum, copper, tungsten, gold, silver and alloys thereof.

25. The process of claim 1 wherein the second metal layer is deposited using a process selected from the group consisting of chemical vapor deposition, plasma enhanced chemical vapor deposition, physical vapor deposition, sputter deposition, electroplating and electroless plating.

26. A process for enclosing a via in a semiconductor device, the process comprising the steps of:

forming a dielectric layer over a first metal layer, wherein the dielectric layer has a thickness;

forming a partial via in the dielectric layer, wherein the partial via has a depth less than the thickness of the dielectric layer, thereby defining a partial via bottom and a partial via sidewall;

conformally depositing a first metal liner in the partial via, wherein the first metal liner includes a sidewall portion deposited over the partial via sidewall;

forming at least one trench in the dielectric layer adjacent to the first metal liner, wherein the trench has a depth less than the thickness of the dielectric layer, thereby defining a trench sidewall and a trench bottom and exposing a portion of said sidewall portion of the first metal liner;

forming a full via in the dielectric layer which comprises the partial via and a portion extending from the partial via bottom to the first metal layer, wherein the full via has a depth at least equal to the thickness of the dielectric layer, thereby defining a via sidewall of the dielectric layer and exposing a portion of the first metal layer;

conformally depositing a second metal liner in the trench and in the full via, wherein at least a portion of the second metal liner is deposited over the trench sidewall and the trench bottom, over said via sidewall of the dielectric layer, and over said exposed portion of the first metal layer; and depositing a second metal layer over the first metal liner and second metal liner, wherein the second metal layer substantially fills the trench and the full via.

27. A process for enclosing a via in a semiconductor device, the process comprising the steps of:

forming a dielectric layer over a first metal layer, wherein the dielectric layer has a thickness;

forming a trench in the dielectric layer, wherein the trench has a depth less than the thickness of the dielectric layer, thereby defining a trench bottom and a trench sidewall;

conformally depositing a first metal liner in the trench, wherein the first metal liner includes a bottom portion deposited over the trench bottom and a sidewall portion deposited over the trench sidewall;

forming at least one via in the dielectric layer adjacent to the first metal liner, wherein the via has a depth at least equal to the thickness of the dielectric layer, thereby defining a sidewall of the dielectric layer and exposing a portion of the first metal layer and a portion of said sidewall portion of the first metal liner;

conformally depositing a second metal liner in the via, wherein at least a portion of the second metal liner is deposited over said sidewall of the dielectric layer and over said exposed portion of the first metal layer; and depositing a second metal layer over the first metal liner and second metal liner, wherein the second metal layer substantially fills the trench and the via.

* * * * *